(12) United States Patent
Takata et al.

(10) Patent No.: US 9,236,491 B2
(45) Date of Patent: Jan. 12, 2016

(54) HIGH MOBILITY FIELD EFFECT TRANSISTOR WITH ZN CONTAINING ACTIVE LAYER, DISPLAY DEVICE, SENSOR, AND METHOD OF MANUFACTURING FIELD EFFECT TRANSISTOR

(71) Applicant: FUJIFILM Corporation, Tokyo (JP)

(72) Inventors: Masahiro Takata, Kanagawa (JP); Atsushi Tanaka, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/967,065

(22) Filed: Aug. 14, 2013

(65) Prior Publication Data

US 2013/0328045 A1    Dec. 12, 2013

Related U.S. Application Data

(63) Continuation of application No. PCT/JP2012/054006, filed on Feb. 20, 2012.

(30) Foreign Application Priority Data

Mar. 14, 2011    (JP) ................................. 2011-055559

(51) Int. Cl.
*H01L 29/10* (2006.01)
*H01L 21/00* (2006.01)
(Continued)

(52) U.S. Cl.
CPC ...... *H01L 29/7869* (2013.01); *H01L 27/14658* (2013.01); *H01L 29/66969* (2013.01); *H01L 29/78696* (2013.01); *G02F 1/1368* (2013.01); *G02F 2001/13685* (2013.01); *H01L 27/3262* (2013.01)

(58) Field of Classification Search
CPC ...................... H01L 29/7869; H01L 29/66969; H01L 29/78696; H01L 27/14658
USPC ............. 257/43, 59, 72; 438/85, 86, 104, 754
See application file for complete search history.

(56) References Cited

U.S. PATENT DOCUMENTS

| | | | |
|---|---|---|---|
| 2008/0038882 A1 | 2/2008 | Takechi et al. | |
| 2008/0191204 A1 | 8/2008 | Kim et al. | |

(Continued)

FOREIGN PATENT DOCUMENTS

| | | |
|---|---|---|
| JP | 2007-073701 A | 3/2007 |
| JP | 2008042088 A | 2/2008 |

(Continued)

OTHER PUBLICATIONS

Notice of Reasons for Rejection, dated Oct. 29, 2013, issued in corresponding JP Application No. 2011-055559, 4 pages in English and Japanese.

(Continued)

*Primary Examiner* — Hung Vu
(74) *Attorney, Agent, or Firm* — Sughrue Mion, PLLC

(57) ABSTRACT

A field effect transistor including: a gate insulating film; an oxide semiconductor layer that serves as an active layer and whose main structural elements are Sn, Zn and O, or Sn, Ga, Zn and O; and an oxide intermediate layer that is disposed between the gate insulating film and the oxide semiconductor layer, and whose resistivity is higher than that of the oxide semiconductor layer.

11 Claims, 12 Drawing Sheets

(51) Int. Cl.
  *H01L 29/786* (2006.01)
  *H01L 29/66* (2006.01)
  *H01L 27/146* (2006.01)
  *G02F 1/1368* (2006.01)
  *H01L 27/32* (2006.01)

(56) References Cited

U.S. PATENT DOCUMENTS

| | | |
|---|---|---|
| 2009/0321731 A1 | 12/2009 | Jeong et al. |
| 2010/0181565 A1* | 7/2010 | Sakata et al. .................. 257/43 |
| 2010/0264412 A1* | 10/2010 | Yamazaki et al. ............. 257/43 |
| 2011/0042669 A1 | 2/2011 | Kim et al. |
| 2011/0097844 A1 | 4/2011 | Takechi et al. |
| 2013/0237012 A1 | 9/2013 | Takechi et al. |

FOREIGN PATENT DOCUMENTS

| | | |
|---|---|---|
| JP | 2008199005 A | 8/2008 |
| JP | 2010-016348 A | 1/2010 |
| JP | 2010-050165 A | 3/2010 |
| JP | 2010-114413 A | 5/2010 |
| JP | 2010-165922 A | 7/2010 |

OTHER PUBLICATIONS

International Search Report of PCT/JP2012/054006 dated Jun. 5, 2012, 7 pages in Japanese and English.
Written Opinion of the ISA of PCT/JP2012/054006 dated Jun. 5, 2012, 12 pages in Japanese and English.
Notice of Reasons for Rejection, dated May 20, 2014, issued in corresponding JP Application No. 2011-055559, 4 page in English and Japanese.

* cited by examiner

HIGH MOBILITY FIELD EFFECT TRANSISTOR WITH ZN CONTAINING ACTIVE LAYER, DISPLAY DEVICE, SENSOR, AND METHOD OF MANUFACTURING FIELD EFFECT TRANSISTOR

CROSS-REFERENCE TO RELATED APPLICATIONS

This application is a continuation application of International Application No. PCT/JP2012/054006, filed Feb. 20, 2012, the disclosure of which is incorporated herein by reference in its entirety. Further, this application claims priority from Japanese Patent Application No. 2011-055559, filed Mar. 14, 2011, the disclosure of which is incorporated herein by reference in its entirety.

BACKGROUND

1. Technical Field

The present invention relates to a field effect transistor, a display device, a sensor, and a method of fabricating a field effect transistor.

2. Related Art

Field effect transistors are widely used as unit elements of integrated circuits for semiconductor memories, high-frequency signal amplifying elements, elements for driving display elements such as liquid crystals, and the like. Field effect transistors that are made to be thin-filmed in particular are called thin film transistors (TFTs). Further, a silicon TFT, that has an active layer formed from amorphous silicon that can be formed over a large surface area, is used in flat panel displays.

The development of TFTs, that use an In—Ga—Zn—O (hereinafter abbreviated as "IGZO") oxide semiconductor thin film in the active layer (channel layer) instead of this amorphous silicon, has been carried out actively in recent years. An oxide semiconductor thin film can be formed at a low temperature and exhibits higher mobility that amorphous silicon, and further, because an oxide semiconductor thin film is transparent with respect to visible light, a flexible, transparent TFT can be formed on a substrate such as a plastic plate or a film or the like.

However, in order to fabricate a TFT that is IGZO and has high mobility, post-annealing at a high temperature (e.g., greater than or equal to 400° C. in the atmosphere) is needed, and it is difficult to form TFTs on flexible substrates that have low heat-resistance.

By the way, differently than an IGZO semiconductor thin film, an Sn—Ga—Zn—O (hereinafter abbreviated as "SGZO") oxide semiconductor thin film, that uses Sn instead of the In in IGZO, does not contain In that is a rare metal, and $Sn^{4+}$ has the same electron arrangement as $In^{3+}$. Therefore, SGZO semiconductor thin films are anticipated as novel oxide semiconductor thin films that replace IGZO semiconductor thin films. Note that, among the aforementioned "SGZO", the Ga does not have to be essential.

Thus, Japanese Patent Application Laid-Open No. 2010-50165 discloses a TFT in which a first metal oxide layer, that is formed on a gate insulating film and contains at least one element among In, Sn and Zn and the like, is made to be the active region, and a second metal oxide layer, that does not contain In and whose sheet resistance is higher than the first metal oxide layer, is layered on the first metal oxide layer.

Further, Japanese Patent Application Laid-Open No. 2010-16348 discloses a TFT having an interface stabilizing layer at at least one surface among the top surface and the bottom surface of an active layer that is structured by doping ZnO with ions of at least one among Ga, In, Sn or the like.

However, in the TFT disclosed in Japanese Patent Application Laid-Open No. 2010-50165, Sn is not essential as a structural element of the first metal oxide layer (active layer) that becomes the active region. Further, in this transistor, the first metal oxide layer is disposed between the gate insulating film and the second metal oxide layer in order to aim for stabilization of the threshold voltage, but it is thought that an improvement in mobility is not devised by such an arrangement.

Further, the TFT disclosed in Japanese Patent Application Laid-Open No. 2010-16348 has an interface stabilizing layer that can become an intermediate layer between the gate insulating film and the active layer, but Sn is not essential as a structural element of the active layer. Further, in Japanese Patent Application Laid-Open No. 2010-16348, the object is to aim for improvement of the interface characteristic, and improvement of the mobility of a TFT, that has an active layer structured by an SGZO oxide semiconductor, is not disclosed or suggested in any way.

SUMMARY

The present invention was made in consideration of the above-described circumstances, and an object thereof is to provide a field effect transistor, a display device, a sensor, and a method of fabricating a field effect transistor having improved mobility even while being provided with an oxide semiconductor layer, whose main structural elements are Sn, Zn and O, or Sn, Ga, Zn and O, as an active layer.

The above-described topic of the present invention is solved by the following means.

<1> A field effect transistor comprising a gate insulating film; an oxide semiconductor layer that serves as an active layer and whose main structural elements are Sn, Zn and O, or Sn, Ga, Zn and O; and an oxide intermediate layer that is disposed between the gate insulating film and the oxide semiconductor layer, and whose resistivity is higher than that of the oxide semiconductor layer.

<2> The field effect transistor of <1>, wherein main structural elements of the oxide intermediate layer are In, Ga, Zn and O, or Sn, Ga, Zn and O.

<3> The field effect transistor of <2>, wherein main structural elements of the oxide intermediate layer are In, Ga, Zn and O.

<4> The field effect transistor of any one of <1> through <3>, wherein main structural elements of the oxide semiconductor layer are Sn, Ga, Zn and O.

<5> The field effect transistor of any one of <1> through <4>, wherein, in a case in which an element composition ratio of the oxide semiconductor layer is Sn:Ga:Zn=a:b:c, the element composition ratio satisfies a+b=2, and $1 \leq a \leq 2$, and $1 \leq c \leq 11/2$, and $c \geq -7b/4 + 11/4$.

<6> The field effect transistor of any one of Claim 1 through Claim 5, wherein the oxide semiconductor layer is amorphous.

<7> The field effect transistor of any one of <1> through <6>, wherein a resistivity of the oxide semiconductor layer is greater than or equal to 1 Ωcm and less than or equal to $1 \times 10^6$ Ωcm.

<8> The field effect transistor of any one of <1> through <7>, wherein a film thickness of the oxide intermediate layer is greater than or equal to 1 nm and less than or equal to 50 nm.

<9> A display device comprising the field effect transistor of any one of <1> through <8>.

<10> A sensor comprising the field effect transistor of any one of <1> through <8>.

<11> A method of fabricating a field effect transistor comprising, in order: a first step of film-forming, on a gate insulating film that is formed on a substrate, an oxide intermediate layer whose main structural elements are In, Ga, Zn and O, or Sn, Ga, Zn and O; a second step of film-forming, on the oxide intermediate layer, an oxide semiconductor layer whose main structural elements are Sn, Zn and O, or Sn, Ga, Zn and O, and that, in a case in which an element composition ratio of the structural elements is Sn:Ga:Zn=a:b:c, the element composition ratio satisfies a+b=2, and 1≤a≤2, and 1≤c≤11/2, and c≥−7b/4+ 11/4; and a third step of carrying out a heat treatment at greater than or equal to 100° C. and less than 300° C.

<12> A method of fabricating a field effect transistor comprising: a first step of film-forming, on a substrate, an oxide semiconductor layer whose main structural elements are Sn, Zn and O, or Sn, Ga, Zn and O, and that, in a case in which an element composition ratio of the structural elements is Sn:Ga:Zn=a:b:c, the element composition ratio satisfies a+b=2, and 1≤a≤2, and 1≤c≤11/2, and c≥−7b/4+ 11/4; a second step of film forming, on the oxide semiconductor layer, an oxide intermediate layer whose main structural elements are In, Ga, Zn and O, or Sn, Ga, Zn and O; a third step of forming a gate insulating film on the oxide intermediate layer; and a fourth step of, after the second step or after the third step, carrying out a heat treatment at greater than or equal to 100° C. and less than 300° C.

<13> The method of fabricating a field effect transistor of <11> or <12>, wherein the oxide semiconductor layer and the oxide intermediate layer are film-formed by sputtering.

Advantageous Effects of Invention

In accordance with the present invention, there can be provided a field effect transistor, a display device, a sensor, and a method of fabricating a field effect transistor having improved mobility even while being provided with an active layer that is structured by an oxide semiconductor whose main structural elements are Sn, Zn and O, or Sn, Ga, Zn and O.

BRIEF DESCRIPTION OF THE DRAWINGS

An exemplary embodiment of the present invention will be described in detail based on the following figures, wherein.

DETAILED DESCRIPTION

Figure 1A:
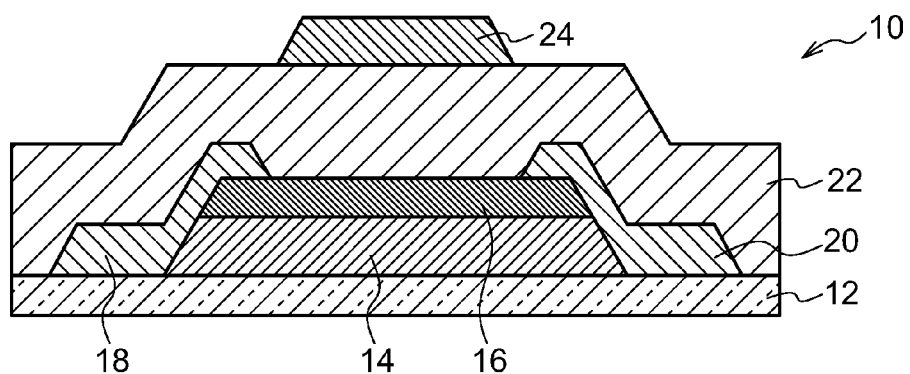
FIG. 1A is a schematic drawing showing an example of a TFT that has a top gate structure and is a top contacting type, and that is a TFT relating to an embodiment of the present invention.

The field effect transistor, display device, sensor, and method of fabricating a field effect transistor relating to embodiments of the present invention are described concretely hereinafter with reference to the appended drawings. Note that, in the drawings, members (structural elements) that have the same or corresponding functions are denoted by the same reference numerals and description is omitted appropriately.

1. Field Effect Transistor

A method of fabricating a field effect transistor relating to an embodiment of the present invention is described concretely by using a TFT as an example.

<Schematic Structure of TFT>

A TFT relating to an embodiment of the present invention is an active element that has a gate electrode, a gate insulating film, an active layer, a source electrode and a drain electrode, and that applies voltage to the gate electrode, and controls the current flowing to the active layer, and has the function of switching current between the source electrode and the drain electrode. Further, in the TFT relating to the embodiment of the present invention, an oxide intermediate layer is further disposed between the gate insulating film and the active layer.

The element structure of the TFT may be either of a so-called reverse staggered structure (also called bottom gate type) or a staggered structure (also called top gate type), that are based on the position of the gate electrode. Further, the TFT may be either of a so-called top contacting type or bottom contacting type, that is based on the contacting portions of the active layer and the source electrode and the drain electrode (hereinafter called source/drain electrodes).

Note that a top gate type is a form in which the gate electrode is disposed at the upper side of the gate insulating film, and the active layer is formed at the lower side of the gate insulating film. A bottom gate type is a form in which the gate electrode is disposed at the lower side of the gate insulating film, and the active layer is formed at the upper side of the gate insulating film. Further, a bottom contacting type is a form in which the source/drain electrodes are formed before the active layer, and the bottom surface of the active layer contacts the source/drain electrodes. A top contacting type is a form in which the active layer is formed before the source/drain electrodes, and the top surface of the active layer contacts the source/drain electrodes.

FIG. 1A is a schematic drawing showing an example of a TFT that has a top gate structure and is a top contacting type, and that is a TFT relating to an embodiment of the present invention. In a TFT 10 shown in FIG. 1A, an oxide semiconductor layer 14, that becomes the active layer, and an oxide intermediate layer 16, that relates to the embodiment of the present invention, are layered in order on one main surface of a substrate 12. Further, a source electrode 18 and a drain electrode 20 are set so as to be apart from one another on this oxide intermediate layer 16, and further, a gate insulating film 22 and a gate electrode 24 are layered in order on these.

Figure 1B:
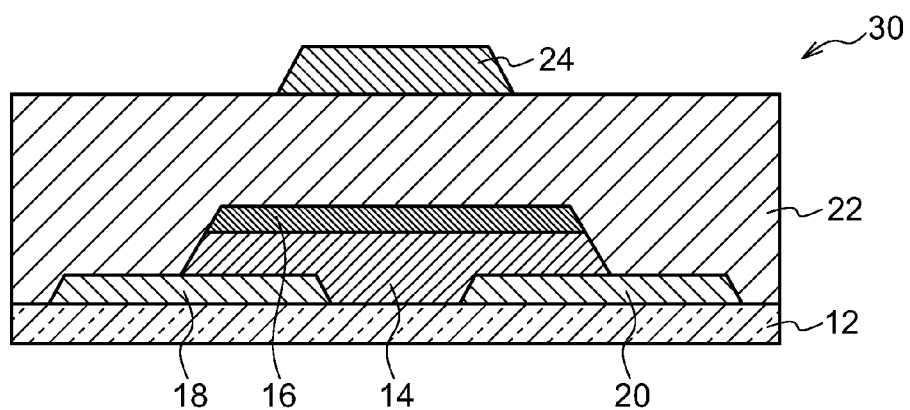
FIG. 1B is a schematic drawing showing an example of a TFT that has a top gate structure and is a bottom contacting type, and that is a TFT relating to an embodiment of the present invention.

FIG. 1B is a schematic drawing showing an example of a TFT that has a top gate structure and is a bottom contacting type, and that is a TFT relating to an embodiment of the present invention. In a TFT 30 shown in FIG. 1B, the source electrode 18 and the drain electrode 20 are set so as to be apart from one another, on one main surface of the substrate 12. Further, the oxide semiconductor layer 14 that becomes the active layer, the oxide intermediate layer 16 that relates to the embodiment of the present invention, the gate insulating film 22, and the gate electrode 24 are layered in order.

Figure 1C:
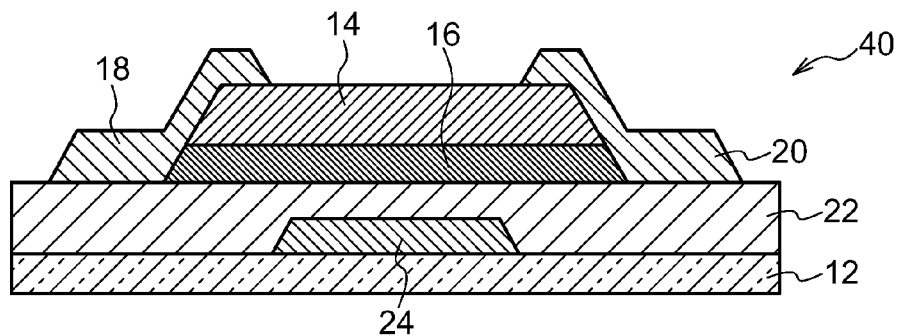
FIG. 1C is a schematic drawing showing an example of a TFT that has a bottom gate structure and is a top contacting type, and that is a TFT relating to an embodiment of the present invention.

FIG. 1C is a schematic drawing showing an example of a TFT that has a bottom gate structure and is a top contacting type, and that is a TFT relating to an embodiment of the present invention. In a TFT 40 shown in FIG. 1C, the gate electrode 24, the gate insulating film 22, the oxide intermediate layer 16 that relates to the embodiment of the present invention, and the oxide semiconductor layer 14 that becomes the active layer are layered in order on one main surface of the substrate 12. Further, the source electrode 18 and the drain electrode 20 are set so as to be apart from one another on the surface of this oxide semiconductor layer 14.

Figure 1D:
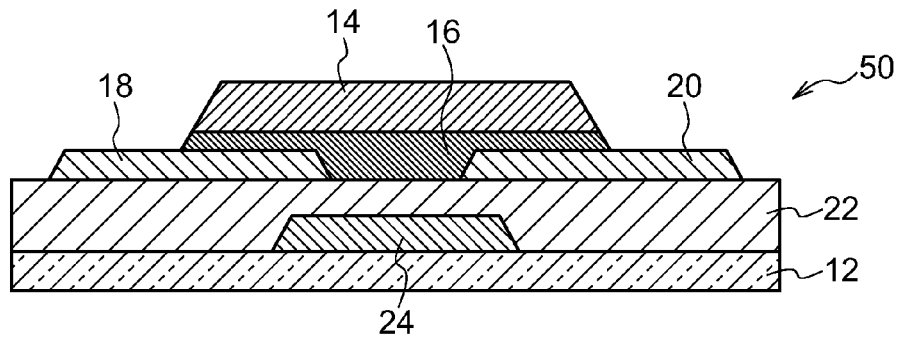
FIG. 1D is a schematic drawing showing an example of a TFT that has a bottom gate structure and is a bottom contacting type, and that is a TFT relating to an embodiment of the present invention.

FIG. 1D is a schematic drawing showing an example of a TFT that has a bottom gate structure and is a bottom contacting type, and that is a TFT relating to an embodiment of the present invention. In a TFT 50 shown in FIG. 1D, the gate electrode 24 and the gate insulating film 22 are layered in order on one main surface of the substrate 12. Further, the source electrode 18 and the drain electrode 20 are set so as to be apart from one another on the surface of this gate insulating film 22, and further, the oxide intermediate layer 16 that relates to the embodiment of the present invention, and the oxide semiconductor layer 14 that becomes the active layer, are layered in order thereon.

Note that the TFT relating to the present embodiment can be made to be various structures other than those described above, and may be a structure that appropriately has a protective layer on the active layer, or an insulating layer on the substrate, or the like.

The respective structural elements are described in detail hereinafter. Note that a case of fabricating the TFT 10, that has a top gate structure and is a top contacting type and that is shown in FIG. 1A, is described concretely as a representative example. However, the present invention can similarly be applied also to cases of fabricating TFTs of other forms.

<Detailed Structure of TFT>

—Substrate—

First, the substrate 12 for forming the TFT 10 is readied. The shape, structure, size and the like of the substrate 12 are not particularly limited, and can be selected appropriately in accordance with the object. The structure of the substrate 12 may be a single-layer structure or may be a layered structure.

The material of the substrate 12 is not particularly limited, and, for example, inorganic substrates such as glass, YSZ (yttria-stabilized zirconium), and the like, or resin substrates, or composite materials thereof, or the like can be used. Among these, from the standpoint of being light weight and from the standpoint of having flexibility, resin substrates and composite materials thereof are preferable. Concretely, composite resin substrates of polybutylene terephthalate, polyethylene terephthalate, polyethylene naphthalate, polybutylene naphthalate, polystyrene, polycarbonate, polysulfone, polyethersulfone, polyallylate, allyl diglycol carbonate, polyamide, polyimide, polyamide-imide, polyetherimide, polybenzoazole, polyphenylene sulfide, polycycloolefin, norbornene resins, fluorine resins such as polychlorotrifluoroethylene and the like, liquid crystal polymers, acrylic resins, epoxy resins, silicone resins, ionomer resins, cyanate resins, cross-linked fumaric acid diester, cyclic polyolefins, aromatic ethers, maleimide-olefin, cellulose, episulfide compounds and the like, compound plastic materials with silicon oxide particles, compound plastic materials with metal nanoparticles, inorganic oxide nanoparticles, inorganic nitride nanoparticles and the like, compound plastic materials with carbon fibers or carbon nanotubes, compound plastic materials with glass flake, glass fibers or glass beads, compound plastic materials with clay minerals or particles having a mica crystal structure, laminated plastic materials having a junction interface of at least one time between thin glass and the aforementioned individual organic materials, a composite material having a barrier performance and having a junction interface of at least one or more times due to inorganic layers and organic layers being layered alternately, a stainless steel substrate or a metal multi-layer substrate in which stainless steel and different type of metal are laminated, an aluminum substrate or an aluminum substrate with an oxide surface film having an improved insulating ability of the surface due to the surface being subjected to an oxidizing treatment (e.g., an anodic oxidation treatment), and the like can be used. Further, the fact that resin substrates have excellent heat-resistance, dimensional stability, solvent resistance, electrical insulating ability, workability, low permeability, low moisture absorbing ability, and the like, is preferable. The aforementioned resin substrates may have a gas barrier layer for preventing passage of moisture and oxygen, or an undercoat layer for improving the flatness of the resin substrate and the adhesiveness with the lower electrodes, or the like.

Further, the thickness of the substrate 12 in the present invention is not particularly limited, but greater than or equal to 50 μm and less than or equal to 1000 μm is preferable, and greater than or equal to 50 μm and less than or equal to 500 μm is more preferable. When the thickness of the substrate 12 is greater than or equal to 50 μm, the flatness of the substrate 12 itself improves more. Further, when the thickness of the substrate 12 is less than or equal to 500 μm, the flexibility of the substrate 12 itself improves more, and usage as a substrate for a flexible device is even easier.

—Oxide Semiconductor Layer—

Next, the oxide semiconductor layer 14, that becomes mainly the active layer (region), is formed as a transistor on the substrate 12.

Sn, Zn and O, or Sn, Ga, Zn and O, are the main structural elements of the oxide semiconductor layer 14. Among these, from the standpoint of electrical stability, making Sn, Ga, Zn and O be the main structural elements is preferable. Note that "main structural elements" means that the total proportion of the Sn, Zn and O, or of the Sn, Ga, Zn and O, with respect to all of the structural elements of the oxide semiconductor layer 14 is greater than or equal to 98%.

Further, when Sn, Zn and O, or Sn, Ga, Zn and O, are made to be the main structural elements, in a case in which the composition ratio thereof is Sn:Ga:Zn=a:b:c, it is preferable that this composition ratio satisfy a+b=2, and 1≤a≤2, and 1≤c≤11/2, and c≥−7b/4+11/4. By using materials in the present composition ratio, the moisture content within the oxide semiconductor layer 14 is reduced, and dispersion in the moisture content after low-temperature annealing also is suppressed. Due thereto, dispersion in the electrical characteristic, that accompanies this dispersion in the moisture content, also is suppressed, and a lowering of the resistance of the oxide semiconductor layer 14 at the time of low-temperature annealing also does not occur, and designing of the device is easy.

Further, the oxide semiconductor layer 14 may be either of amorphous or crystalline. However, if the oxide semiconductor layer 14 is amorphous, film formation at a low temperature is possible, and therefore, the oxide semiconductor layer 14 is suitably formed on the substrate 12 that is flexible. Note that whether the oxide semiconductor layer 14 is amorphous or not can be confirmed by X-ray diffraction measurement. Namely, if clear peaks expressing a crystalline structure are not detected from X-ray diffraction measurement, it can be judged that that oxide semiconductor layer 14 is amorphous.

The film thickness of the oxide semiconductor layer 14 is not particularly limited, but, from the standpoints of flatness of the thin film and the film formation time, greater than or equal to 5 nm and less than or equal to 150 nm is preferable.

As the film forming method of the oxide semiconductor layer 14, it is preferable to use a vapor-phase film forming method in which the target is a polycrystalline sintered body of an oxide semiconductor whose main structural elements are Sn, Zn and O, or Sn, Ga, Zn and O. Among vapor-phase film forming methods, a sputtering method and a pulse laser deposition method (PLD method) are suitable. Further, from the standpoint of mass-produceability, a sputtering method is preferable. For example, by using an RF magnetron sputtering deposition method, a film is formed while controlling the degree of vacuum and the oxygen flow amount.

In particular, as the method of forming an oxide semiconductor thin film whose Sn, Ga, Zn composition ratio is a composition ratio such as described above by a sputtering method, independent sputtering of composite oxide targets that is such that the Sn, Ga, Zn composition ratio within the formed oxide semiconductor thin film will become a composition ratio such as described above may be used, or co-sputtering that uses, in combination, Sn, Ga, Zn or simple oxides thereof or a composite oxide target thereof may be used.

It suffices for the resistivity of the oxide semiconductor layer 14 to be a resistivity that is such that the oxide semiconductor layer 14 behaves as a semiconductor generally, and, in particular, from the standpoint of making the oxide semiconductor layer 14 be an active region, it is preferable that the resistivity at room temperature (20° C.) be greater than or equal to 1 Ωcm and less than or equal to $1 \times 10^6$ Ωcm. In order to control the resistivity of the oxide semiconductor layer 14, the oxygen partial pressure within the film formation chamber at the time of film formation is controlled arbitrarily. The method of controlling the oxygen partial pressure within the film formation chamber may be a method of varying the $O_2$ gas amount that is introduced into the film formation chamber, or may be a method of varying the introduced amount of oxygen radicals or ozone gas. Further, in a case in which the resistance is high even if the introduction of oxygen gas is stopped, a method of lowering the partial pressure of all of the gases within the film formation chamber, or a method of introducing a reducing gas such as $H_2$ or $N_2$ or the like, may be used. If the oxygen partial pressure is made to be high, the electrical conductivity of the oxide semiconductor layer 14 can be lowered (the resistivity can be raised). If the oxygen partial pressure is made to be low, the oxygen defects within the film are increased and the electrical conductivity of the oxide semiconductor layer 14 can be raised (the resistivity can be lowered).

Note that the resistivity of the present embodiment is a value measured by the 4-terminal method (using source measure unit SMU237 manufactured by Keithley Co. as the current source, and nanovoltmeter 2128A manufactured by Keithley Co. as the voltmeter, and a portion is measured by the 2-terminal method).

After film formation of the oxide semiconductor thin film, this thin film is patterned in accordance with the device, and the oxide semiconductor layer 14 is formed. The patterning can be carried out by photolithography and etching. Concretely, a pattern is formed by forming a resist pattern by photolithography at the portions that are to remain, and by etching by using an acid solution of hydrochloric acid, nitric acid, dilute sulfuric acid, or a mixed liquid of phosphoric acid, nitric acid and acetic acid, or the like.

—Oxide Intermediate Layer—

The oxide intermediate layer 16 is formed on the oxide semiconductor layer 14. The resistivity of this oxide intermediate layer 16 is made to be higher than that of the oxide semiconductor layer 14. Therefore, a channel can be formed easily in the oxide semiconductor layer 14. Further, in this way, by providing the oxide intermediate layer 16, whose resistivity is higher than the oxide semiconductor layer 14, between the gate insulating film 22 and the oxide semiconductor layer 14 whose main structural elements are Sn, Zn and O, or In, Ga, Zn and O, the on current and mobility can be improved as compared with a case in which the oxide intermediate layer 16 is not provided. Note that such an effect is a distinctive effect that does not arise in a TFT that is provided with the oxide semiconductor layer 14 that is formed from an IGZO film, and the oxide intermediate layer 16.

The oxide intermediate layer 16 is not particularly limited provided that oxides are made to be the structural elements thereof, but Sn, Ga, Zn and O, or In, Ga, Zn and O, are made to be the main structural elements thereof. Thereamong, it is more preferable to make In, Ga, Zn and O be the main structural elements, from the standpoint of dramatically improving the mobility. Note that "main structural elements" means that the total proportion of the Sn, Ga, Zn and O, or of the In, Ga, Zn and O, with respect to all of the structural elements of the oxide intermediate layer 16 is greater than or equal to 98%.

From the standpoints of flatness and film forming time and the like, the film thickness of the oxide intermediate layer 16 is preferably greater than or equal to 1 nm and less than or equal to 50 nm, and more preferably greater than or equal to 5 nm and less than or equal to 25 nm.

As the film forming method of the oxide intermediate layer 16, it is preferable to use a vapor-phase film forming method in which the target is a polycrystalline sintered body of an oxide whose main structural elements are Sn, Ga, Zn and O, or In, Ga, Zn and O. Among vapor-phase film forming methods, a sputtering method and a pulse laser deposition method (PLD method) are suitable. Further, from the standpoint of mass-produceability, a sputtering method is preferable. For example, by using an RF magnetron sputtering deposition method, a film is formed while controlling the degree of vacuum and the oxygen flow amount. The method of film-forming this oxide intermediate layer 16 by sputtering may be independent sputtering of composite oxide targets, or co-sputtering that uses, in combination, Ga, Zn or simple oxides thereof or a composite oxide thereof.

Further, as described above, the oxide intermediate layer 16 has high resistivity as compared with the oxide semiconductor layer 14, and is for example, greater than $1 \times 10^6$ Ωcm. Controlling of the resistivity of the oxide intermediate layer 16 can be carried out by arbitrarily controlling the oxygen partial pressure within the film formation chamber at the time of film formation. The method of controlling the oxygen partial pressure within the film formation chamber may be a method of varying the $O_2$ gas amount that is introduced into the film formation chamber, or may be a method of varying the introduced amount of oxygen radicals or ozone gas. By making the partial pressure of all of the gases at the time of film formation be high even if the amount of $O_2$ gas that is introduced into the film formation chamber is the same, the oxygen partial pressure within the film formation chamber can be made to be higher. If the oxygen partial pressure is made to be high, the electrical conductivity of the oxide intermediate layer 16 can be lowered (the resistivity can be raised). If the oxygen partial pressure is made to be low, the oxygen defects within the film are increased and the electrical conductivity of the oxide intermediate layer 16 can be raised (the resistivity can be lowered).

After film formation of the oxide thin film, patterning of this thin film is carried out in accordance with the device, and the oxide intermediate layer 16 is formed. Note that the above describes the case of a top gate structure, but, in the case of a bottom gate structure, rather than carrying out patterning before forming the oxide semiconductor layer 14, it is preferable to carry out patterning simultaneously with the oxide semiconductor layer 14 in order to eliminate the effects of interface contamination.

—Source/Drain Electrodes—

An electrically conductive film for forming the source/drain electrodes 18, 20 is formed on the oxide intermediate layer 16.

The source/drain electrodes can be formed by using a material having high electrical conductivity, and can be formed by using, for example, a metal such as Al, Mo, Cr, Ta, Ti, Au or the like, or a metal oxide electrically conductive film of Al—Nd, an Ag alloy, tin oxide, zinc oxide, indium oxide, indium tin oxide (ITO), indium zinc oxide (IZO) or the like, or the like. These electrically conductive films can be used as a single-layer structure or a layered structure of two or more layers as the source/drain electrodes 18, 20.

In forming the source/drain electrodes 18, 20, a film is formed in accordance with a method that is selected appropriately in consideration of the suitability with the material that is used, from among, for example, wet methods such as a printing method, a coating method or the like, physical methods such as a vacuum deposition method, a sputtering method, an ion plating method or the like, chemical methods such as CVD, a plasma CVD method or the like, and the like.

In consideration of film formability, and the ability to be patterned by etching or a lift-off method, and the electrical conductivity and the like, the film thickness of the electrically conductive film that is formed is preferably made to be greater than or equal to 10 nm and less than or equal to 1000 nm, and more preferably made to be greater than or equal to 50 nm and less than or equal to 500 nm.

Next, the formed electrically conductive film is patterned in a predetermined shape by etching or a lift-off method, and the source electrode and the drain electrode 18, 20 are formed. At this time, it is preferable to simultaneously carry out patterning of the wires that are connected to the source/drain electrodes 18, 20.

—Gate Insulating Film—

After the source/drain electrodes 18, 20 and the wires are formed, the gate insulating film 22 is formed.

The gate insulating film 22 is preferably a film having a high insulating ability, and may be an insulating film of, for example, $SiO_2$, SiNx, SiON, $Al_2O_3$, $Y_2O_3$, $Ta_2O_5$, $HfO_2$ or the like, or may be an insulating film that contains at least two or more of these compounds. The gate insulating film 22 is formed in accordance with a method that is appropriately selected, in consideration of the suitability with the material that is used, from among wet methods such as a printing method, a coating method or the like, physical methods such as a vacuum deposition method, a sputtering method, an ion plating method or the like, chemical methods such as CVD, a plasma CVD method or the like, and the like.

Next, the gate insulating film 22 is patterned into a predetermined shape by photolithography and etching.

Note that the gate insulating film 22 must have thickness in order to decrease the leak current and improve the voltage tolerance, but on the other hand, if the thickness of the gate insulating film is too large, it leads to a rise in the driving voltage. Although it depends on the material of the gate insulating film as well, the thickness of the gate insulating film is preferably greater than or equal to 10 nm and less than or equal to 10 µm, and more preferably greater than or equal to 50 nm and less than or equal to 1000 nm, and particularly preferably greater than or equal to 100 nm and less than or equal to 400 nm.

—Gate Electrode—

After the gate insulating film 22 is formed, the gate electrode 24 is formed.

The gate electrode 24 can be formed by using a material having high electrical conductivity, and can be formed by using, for example, a metal such as Al, Mo, Cr, Ta, Ti, Au or the like, or a metal oxide electrically conductive film of Al—Nd, an Ag alloy, tin oxide, zinc oxide, indium oxide, indium tin oxide (ITO), indium zinc oxide (IZO) or the like, or the like. These electrically conductive films can be used as a single-layer structure or a layered structure of two or more layers as the gate electrode 24.

The gate electrode 24 is film-formed in accordance with a method that is selected appropriately in consideration of the suitability with the material that is used, from among, for example, wet methods such as a printing method, a coating method or the like, physical methods such as a vacuum deposition method, a sputtering method, an ion plating method or the like, chemical methods such as CVD, a plasma CVD method or the like, and the like. In consideration of film formability, and the ability to be patterned by etching or a lift-off method, and the electrical conductivity and the like, the film thickness of the electrically conductive film that is formed is preferably made to be greater than or equal to 10 nm and less than or equal to 1000 nm, and more preferably made to be greater than or equal to 50 nm and less than or equal to 500 nm.

After film formation, the electrically conductive film is patterned in a predetermined shape by etching or a lift-off method, and the gate electrode 24 is formed. At this time, it is preferable to simultaneously carry out patterning of the gate electrode 24 and the gate wires.

—Post-Annealing—

After the gate electrode 24 is patterned, a post-annealing processing is carried out. However, if this post-annealing processing is carried out after film formation of the oxide semiconductor layer 14, the order is not particularly limited. If the post-annealing processing may be carried out immediately after film formation of the oxide semiconductor, the post-annealing processing may be carried out after the film formation or patterning of the electrodes and the insulating film has entirely finished.

In order to suppress dispersion in the electrical characteristic, the post-annealing temperature is preferable greater than or equal to 100° C. and less than 300° C., and, when considering cases in which a flexible substrate is used, the post-annealing is more preferably carried out at greater than or equal to 100° C. and less than or equal to 200° C. If the temperature is greater than or equal to 100° C., the effects of the heat treatment can be exhibited sufficiently. If the temperature is less than 300° C., the characteristic of the TFT can be improved without varying the amount of oxygen defects within the film. If the temperature is less than or equal to 200° C., application to resin substrates that have low heat resistance is easy.

Further, the atmosphere during the post-annealing is preferably made to be an inactive atmosphere or an oxidizing atmosphere. When post-annealing is carried out in a reducing atmosphere, the oxygen within the oxide semiconductor layer comes-out, excess carrier is generated, and it is easy for dispersion in the electrical characteristic to arise.

Moreover, if the humidity of the post-annealing atmosphere is extremely high, it is easy for moisture to be taken-in into the film, and it is easy for dispersion in the electrical characteristic to arise, and therefore, the post-annealing is preferably carried out with the relative humidity at room temperature being less than or equal to 50%.

Still further, although the post-annealing time is not particularly limited, the time that is needed in order for the film temperature to become uniform, and the like, are taken into consideration, and it is preferable to maintain the post-annealing process for at least 10 minutes or more.

The TFT 10, that has a top gate structure and is a top contacting type relating to an embodiment of the present invention, is fabricated by the above-described fabrication processes. To summarize this fabrication method by combining examples among the above-described examples, for example, this is a method of fabricating a TFT that includes a first step of film-forming, on a substrate, an oxide semiconductor layer whose main structural elements are Sn, Zn and O, or Sn, Ga, Zn and O, and that, in a case in which the element composition ratio of these structural elements is Sn:Ga:Zn=a:b:c, the element composition ratio satisfies a+b=2, and $1 \le a \le 2$, and $1 \le c \le 11/2$, and $c \ge -7b/4+11/4$, a second step of film forming, on the oxide semiconductor layer, an oxide intermediate layer whose main structural elements are In, Ga, Zn and O, or Sn, Ga, Zn and O, a third step of forming a gate insulating film on the oxide intermediate layer, and a fourth step of, after the second step or after the third step, carrying out a heat treatment at greater than or equal to 100° C. and less than 300° C.

However, the present invention may be a TFT of a form and fabrication method other than that described above.

For example, in a bottom gate structure, there is method of fabricating a TFT that has, in order, a first step of film-forming, on a gate insulating film that is formed on a substrate, an oxide intermediate layer whose main structural elements are In, Ga, Zn and O, or Sn, Ga, Zn and O, a second step of film-forming, on the oxide intermediate layer, an oxide semiconductor layer whose main structural elements are Sn, Zn and O, or Sn, Ga, Zn and O, and that, in a case in which the element composition ratio of these structural elements is Sn:Ga:Zn=a:b:c, the element composition ratio satisfies a+b=2, and $1 \le a \le 2$, and $1 \le c \le 11/2$, and $c \ge -7b/4+11/4$, and a third step of carrying out a heat treatment at greater than or equal to 100° C. and less than 300° C.

2. Application

There are no limitations in particular on the application of the TFT of the present embodiment that is described above, but the TFT is suitable as a driving element in, for example, electro-optical devices (e.g., display devices such as liquid crystal display devices, organic EL (Electro Luminescence) display devices, inorganic EL display devices and the like, or the like), and particularly in cases of being used in a large-surface-area device.

Moreover, the TFT of the present embodiment is particularly suited to devices that can be fabricated by low-temperature processes using a resin substrate (e.g., flexible displays or the like), and is suitably used as a driving element (a driving circuit) in various types of electronic devices such as various types of sensors such as X-ray sensors, or MEMS (Micro Electro Mechanical Systems), or the like.

3. Electro-Optical Device and Sensor

An electro-optical device or sensor of the present embodiment is structured to have the above-described TFT of the present invention.

Examples of the electro-optical device are display devices (e.g., liquid crystal display devices, organic EL display devices, inorganic EL display devices, and the like).

Examples of the sensor are image sensors such as CCDs (Charge Coupled Devices) or CMOSs (Complementary Metal Oxide Semiconductors) and the like, and X-ray sensors and the like.

The electro-optical device or sensor of the present embodiment exhibits a good characteristic by consuming little electric power. What is called characteristics here means the display characteristic in the case of an electro-optical device (display device) and the sensitivity characteristic in the case of a sensor.

A liquid crystal display device, an organic EL display device, and an X-ray sensor are described hereinafter as representative examples of the electro-optical device or sensor that has the thin-film transistor that is fabricated by the present invention.

4. Liquid Crystal Display Device

Figure 2:
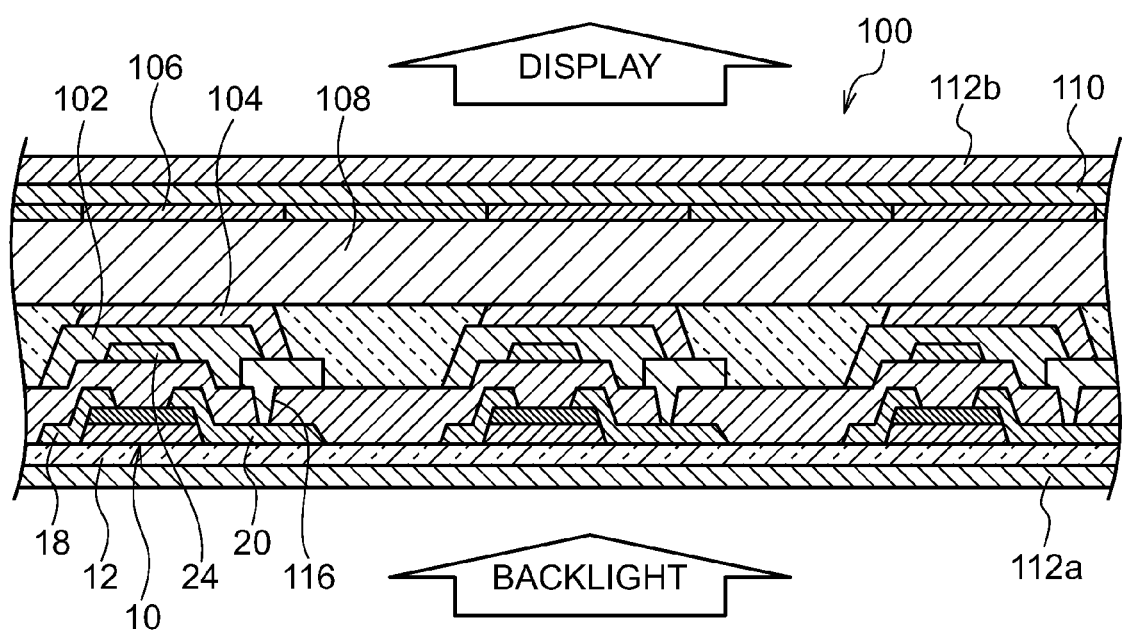
FIG. 2 is a schematic sectional view of a portion of a liquid crystal display device that is one embodiment of an electro-optical device of the present invention.
Figure 3:
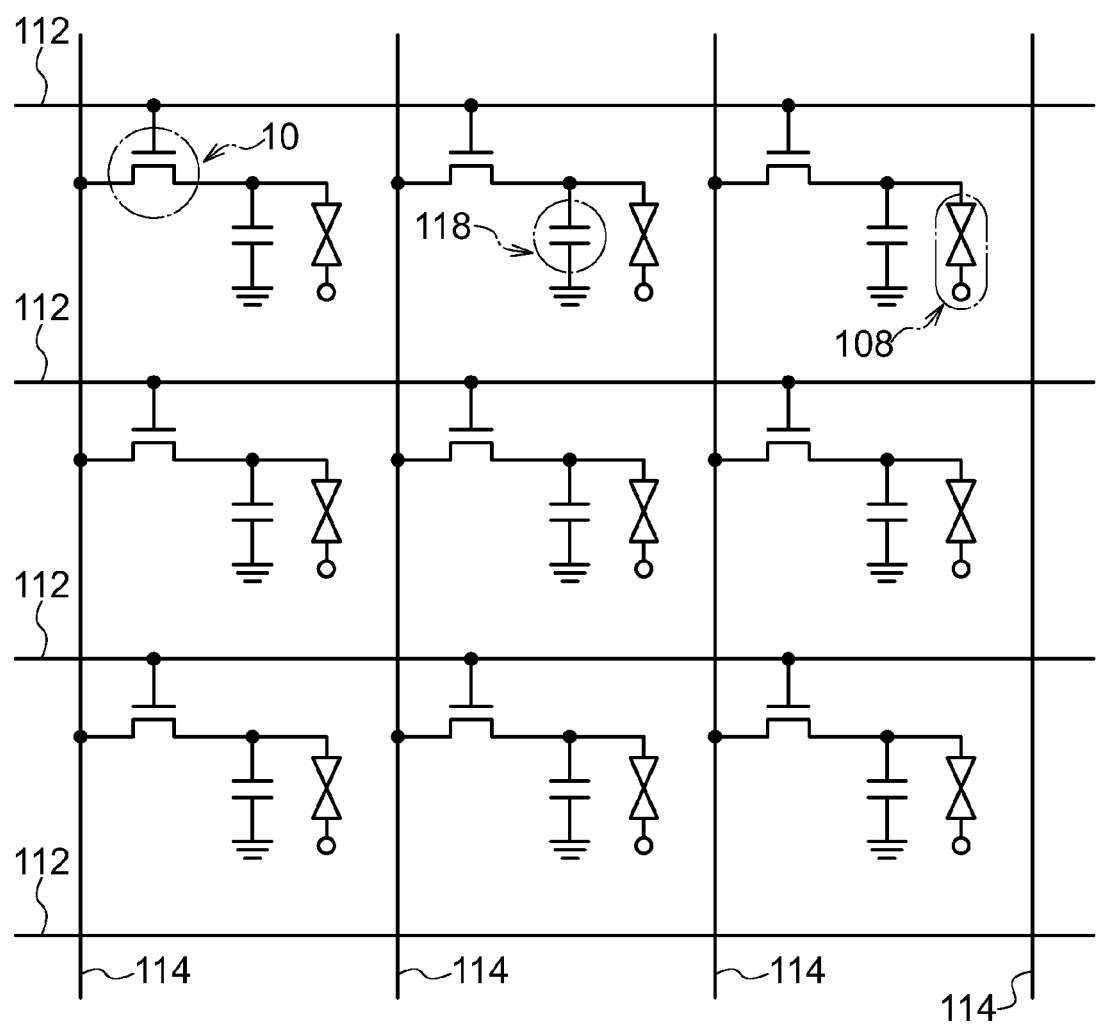
FIG. 3 is a schematic structural drawing of the electrical wiring of the liquid crystal display device shown in FIG. 2.

A schematic sectional view of a portion of a liquid crystal display device that is an embodiment of the electro-optical device of the present invention is shown in FIG. 2, and a schematic structural drawing of the electrical wiring thereof is shown in FIG. 3.

As shown in FIG. 2, a liquid crystal display device 100 of the present embodiment has the TFT 10 that has a top gate structure and is a top contacting type and is shown in FIG. 1A, a liquid crystal layer 108 that is nipped between a pixel lower electrode 104 and an opposing upper electrode 106 thereof on the gate electrode 24 that is protected by a passivation layer 102 of the TFT 10, and an RGB color filter 110 that is for generating different colors in accordance with the respective pixels, and is structured so as to have polarization plates 112a, 112b on the substrate 12 side of the TFT 10 and on the RGB color filter 110, respectively.

Further, as shown in FIG. 3, the liquid crystal display device 100 of the present embodiment has plural gate lines 112 that are parallel to one another, and data lines 114 that are parallel to one another and intersect the gate lines 112. Here, the gate lines 112 and the data lines 114 are electrically insulated. The TFTs 10 are provided in vicinities of the intersecting portions of the gate lines 112 and the data lines 114.

The gate electrode 24 of the TFT 10 is connected to the gate line 112, and the source electrode 18 of the TFT 10 is connected to the data line 114. Further, the drain electrode 20 of the TFT 10 is connected to the pixel lower electrode 104 via a contact hole 116 (an electric conductor is embedded in the contact hole 116) that is provided in the gate insulating film 22. This pixel lower electrode 104, together with the opposing upper electrode 106 that is grounded, structures a capacitor 118.

The liquid crystal device of the present embodiment shown in FIG. 2 has the TFT 10 that has a top gate structure. However, the TFT that is used in the liquid crystal device that is the display device of the present invention is not limited to a top gate structure, and may be a TFT having a bottom gate structure.

Because the TFT that is fabricated in accordance with the present invention has high mobility, low power consumption and high-quality display are possible. In particular, because the TFT has extremely good in-plane uniformity, stability and reliability, the TFT is suited to the manufacturing of a large-screen liquid crystal display device. Further, the TFT, that has a sufficient characteristic, can be fabricated by annealing processing at a low temperature, and therefore, a resin substrate (plastic substrate) can be used as the substrate. Accordingly, in accordance with the present invention, a liquid crystal display device that is uniform over a large surface area and is stable and flexible can be provided.

5. Organic EL Display Device

Figure 4:
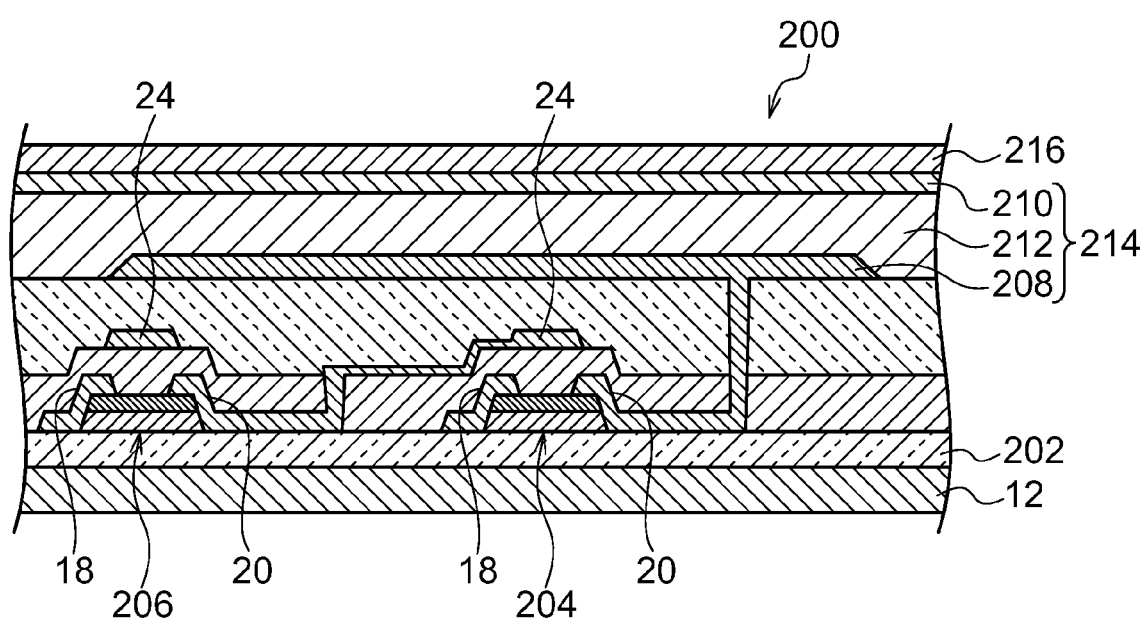
FIG. 4 is a schematic sectional view of a portion of an active matrix organic EL display device that is one embodiment of the electro-optical device of the present invention.
Figure 5:
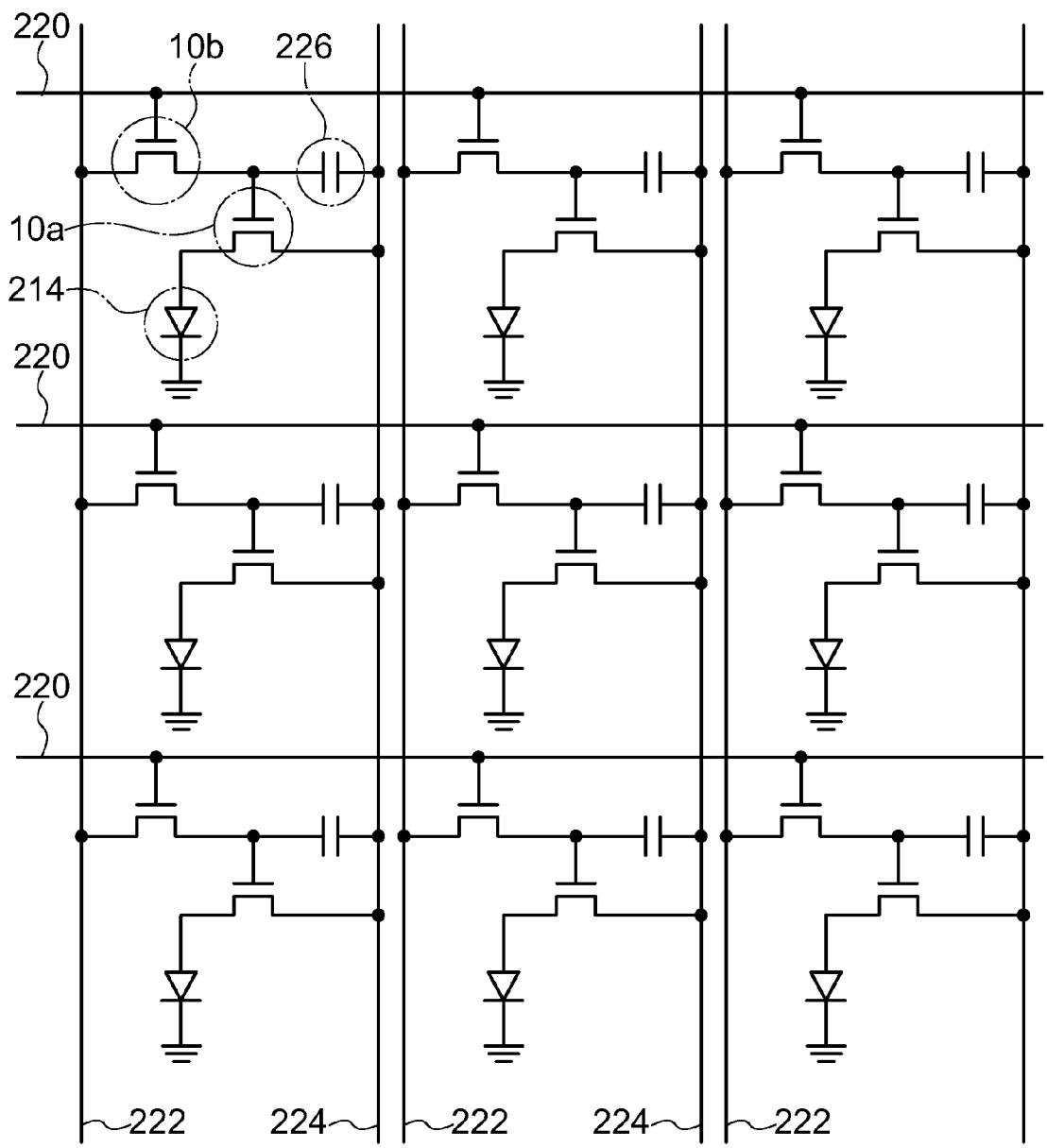
FIG. 5 is a schematic structural drawing of the electrical wiring of the electro-optical device shown in FIG. 4.

A schematic sectional view of a portion of an active-matrix organic EL display device that is an embodiment of the electro-optical device of the present invention is shown in FIG. 4, and a schematic structural drawing of the electrical wiring thereof is shown in FIG. 5.

There are two types of methods for driving an organic EL display device, which are a simple matrix method and an active matrix method. The simple matrix method has the merit that the display device can be manufactured at a low cost, but, because the pixels are made to emit light by selecting the scan lines one-by-one, the number of scan lines and the light-emitting time per scan line are inversely proportional. Therefore, it becomes difficult to increase the definition of the display device and make the display device have a large screen. In the active matrix method, because the transistors and capacitors are formed per pixel, the manufacturing cost is high, but the active matrix method does not have the problem of not being able to increase the number of scan lines as in the simple matrix method, and therefore, is suited to making the display device have higher definition and have a large screen.

An active-matrix organic EL display device 200 of the present embodiment is structured such that the TFT 10, that has the top gate structure and is shown in FIG. 1A, is provided as a TFT 204 for driving and a TFT 206 for switching on the substrate 12 that has a passivation layer 202, and so as to have, above these TFTs 204 and 206, an organic EL light-emitting element 214 that is formed from an organic light-emission layer 212 that is sandwiched between a lower electrode 208 and an upper electrode 210, and such that the upper surface as well is protected by a passivation layer 216.

Further, as shown in FIG. 5, the organic EL display device 200 of the present embodiment has plural gate lines 220 that are parallel to one another, and data lines 222 and driving lines 224 that are parallel to one another and that intersect the gate lines 220. Here, the gate lines 220, and the data lines 222 and driving lines 224, are electrically insulated. The gate electrode 24 of a TFT 10b for switching is connected to the gate line 220, and the source electrode 18 of the TFT 10b for switching is connected to the data line 222. Further, the drain electrode 20 of the TFT 10b for switching is connected to the gate electrode 24 of the TFT 10 for driving, and, by using a capacitor 226, a TFT 10a for driving is maintained in an on state. The source electrode 18 of the TFT 10a for driving is connected to the driving line 224, and the drain electrode 20 is connected to the organic EL light-emitting element 214.

The organic EL device of the present embodiment that is shown in FIG. 4 is provided with the TFTs 10a and 10b that have top gate structures. However, the TFTs that are used in the organic EL device that is a display device of the present invention are not limited to top gate structures, and may be TFTs having bottom gate structures.

Because the TFT that is fabricated in accordance with the present invention has high mobility, low power consumption and high-quality display are possible. In particular, because the TFT has extremely good in-plane uniformity, stability and reliability, the TFT is suited to the manufacturing of a large-screen organic EL display device.

Further, the TFT, that has a sufficient characteristic, can be fabricated by annealing processing at a low temperature, and therefore, a resin substrate (plastic substrate) can be used as the substrate. Accordingly, in accordance with the present invention, an organic EL display device that is uniform over a large surface area and is stable and flexible can be provided.

Note that the organic EL display device shown in FIG. 4 may be a top-emission-type in which the upper electrode 210 is a transparent electrode, or may be a bottom-emission-type by making the lower electrode 208 and the respective electrodes of the TFTs be transparent electrodes.

6. X-Ray Sensor

Figure 6:
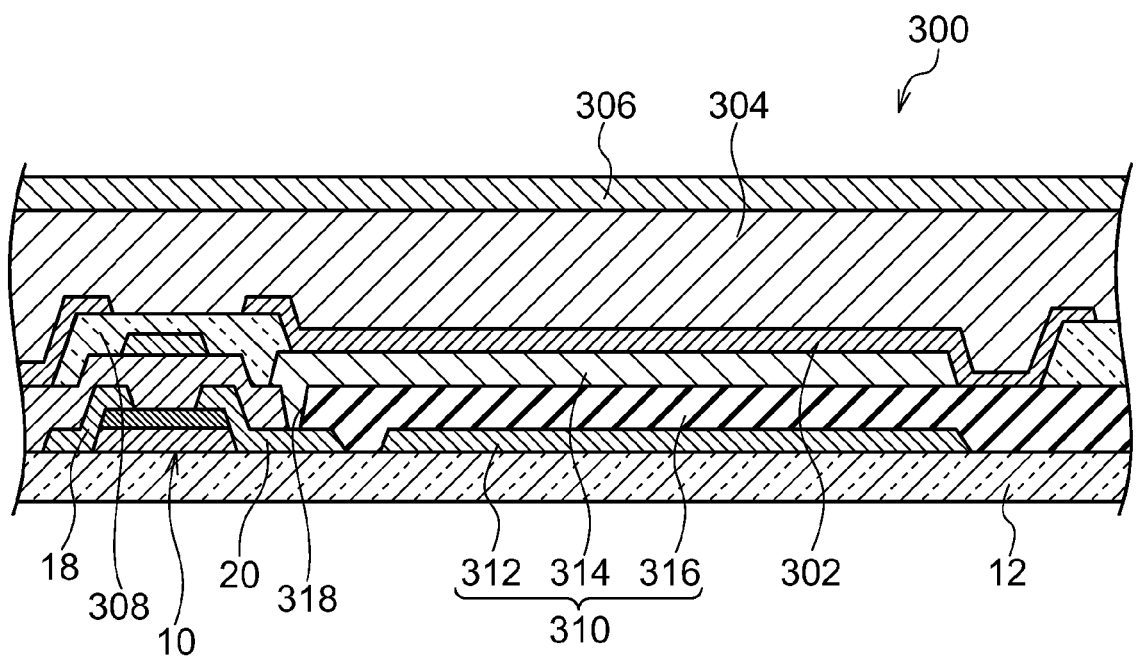
FIG. 6 is a schematic sectional view of a portion of an X-ray sensor that is one embodiment of a sensor of the present invention.
Figure 7:
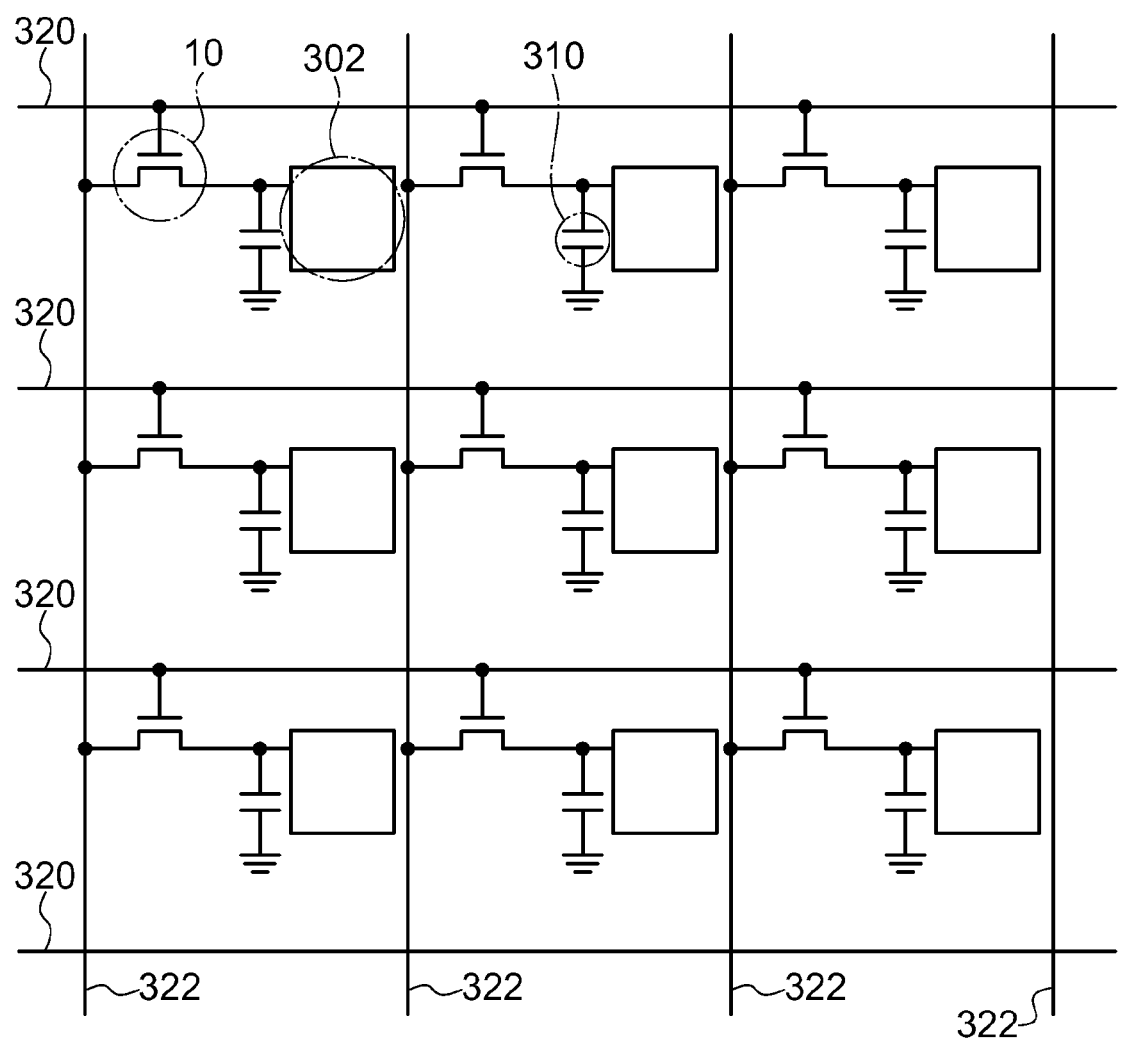
FIG. 7 is a schematic structural drawing of the electrical wiring of the sensor shown in FIG. 6.

A schematic sectional view of a portion of an X-ray sensor that is an embodiment of the sensor of the present invention is shown in FIG. 6, and a schematic structural drawing of the electrical wiring thereof is shown in FIG. 7.

FIG. 6 is a schematic sectional view in which a portion of an X-ray sensor array is enlarged more concretely. An X-ray sensor 300 is structured to have the TFT 10 and a capacitor 310 that are formed on the substrate 12, an electrode 302 for charge collection that is formed on the capacitor 310, an X-ray conversion layer 304, and an upper electrode 306. A passivation film 308 is provided on the TFT 10.

The capacitor 310 is a structure in which an insulating film 316 is sandwiched between a lower electrode 312 for the capacitor and an upper electrode 314 for the capacitor. The upper electrode 314 for the capacitor is connected to either one of the source electrode 18 and the drain electrode 20 of the TFT 10 (in FIG. 6, the drain electrode 20) via a contact hole 318 that is provided in the insulating film 316.

The electrode 302 for charge collection is provided on the upper electrode 314 for the capacitor at the capacitor 310, and contacts the upper electrode 314 for the capacitor.

The X-ray conversion layer 304 is a layer that is formed from amorphous selenium, and is provided so as to cover the TFT 10 and the capacitor 310.

The upper electrode 306 is provided on the X-ray conversion layer 304, and contacts the X-ray conversion layer 304.

As shown in FIG. 7, the X-ray sensor 300 of the present embodiment has plural gate lines 320 that are parallel to one another, and plural data lines 322 that are parallel to one another and intersect the gate lines 320. Here, the gate lines 320 and the data lines 322 are electrically insulated. The TFTs 10 are provided in vicinities of the intersecting portions of the gate lines 320 and the data lines 322.

The gate electrode 24 of the TFT 10 is connected to the gate line 320, and the source electrode 18 of the TFT 10 is connected to the data line 322. Further, the drain electrode 20 of the TFT 10 is connected to the electrode 302 for charge collection, and moreover, this electrode 302 for charge collection is connected to the capacitor 310.

In the X-ray sensor 300 of the present embodiment, X-rays are irradiated from the upper portion (the upper electrode 306 side) in FIG. 6, and electron-hole pairs are generated at the X-ray conversion layer 304. By applying a high electric field by the upper electrode 306 to this X-ray conversion layer 304, the generated charges are accumulated at the capacitor 310, and are read-out by the TFTs 10 being scanned successively.

Because the X-ray sensor 300 of the present embodiment has the TFT 10 that has high mobility and on current and an excellent sensitivity characteristic, the S/N ratio is high and the X-ray sensor 300 is suited to increasing screen sizes. Further, because the sensitivity characteristic is excellent, when the X-ray sensor 300 is used in an X-ray digital imaging device, images of a wide dynamic range are obtained. In particular, the X-ray digital imaging device of the present embodiment is not a device at which only static imaging is possible, and is suited to use as an X-ray digital imaging device at which fluoroscopy by video images and capturing of a static image can be carried out by a single device. Moreover, in cases in which the oxide semiconductor layer 14 at the TFT 10 is amorphous, images having excellent uniformity are obtained.

Note that the X-ray sensor of the present embodiment that is shown in FIG. 6 is provided with the TFT that has a top gate structure, but the TFT that is used in the sensor of the present invention is not limited to a top gate structure, and may be a TFT having a bottom gate structure.

EXAMPLES

Examples are described hereinafter, but the present invention is not limited in any way by these Examples.

Figure 8A:
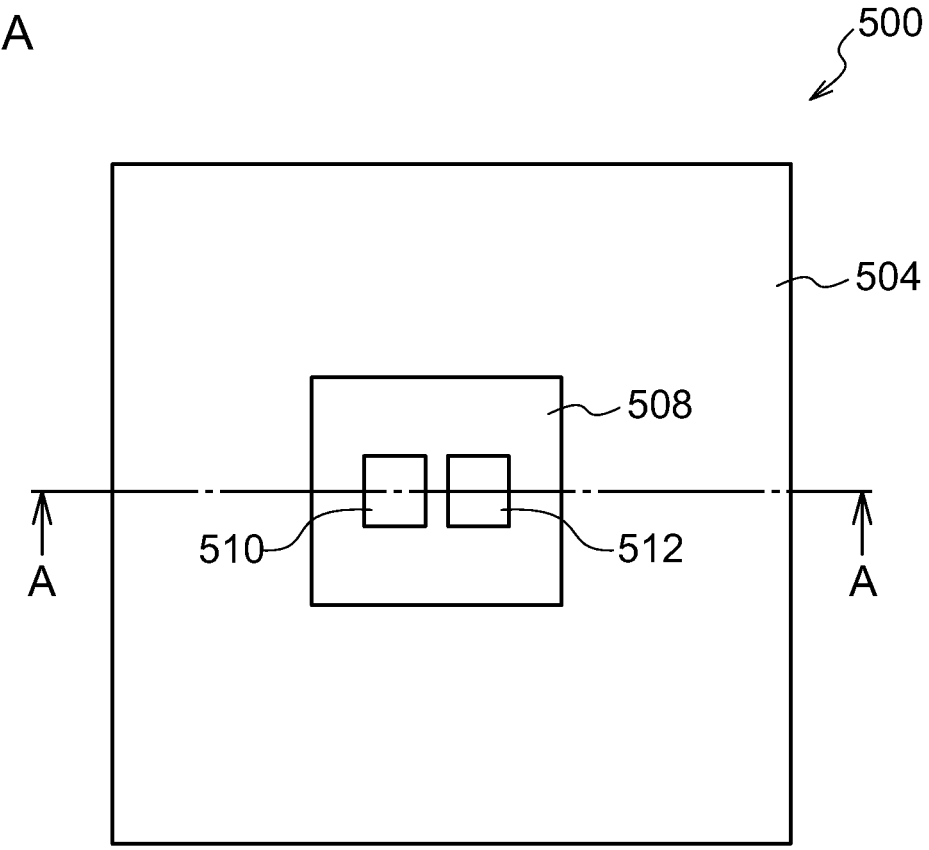
FIG. 8A is a plan view of a TFT of Examples and Comparative Examples.

TFT characteristic evaluation was carried out on TFTs that used, as an oxide semiconductor layer, an SGZO film whose main structural elements were Sn, Zn and O, or Sn, Ga, Zn and O, while changing the absence/presence of an oxide intermediate layer and the type of the oxide intermediate layer. FIG. 8A is a plan view of the TFTs of the Examples and Comparative Examples, and FIG. 8B is a sectional view along arrow A-A of the TFT shown in FIG. 8A.

Figure 8B:
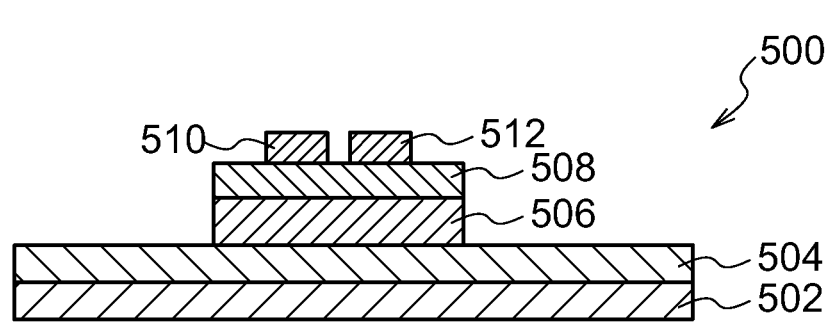
FIG. 8B is cross-sectional view along arrow A-A of the TFT shown in FIG. 8A.

As shown in FIG. 8A and FIG. 8B, in Examples 1 through 4, a simple TFT 500 was fabricated by using, as the substrate, a p-type Si substrate 502 (1 inch square×1 mmt, thickness: 525 μmt, thermal oxidation film ($SiO_2$): 100 nmt) having a thermal oxidation film 504, and by using the thermal oxidation film 504 as a gate insulating film.

Concretely, an oxidation intermediate layer 506 was film-formed by sputtering to a thickness of 5 nm on the p-type Si substrate 502 having a thermal oxidation film, under the conditions that the ultimate vacuum at the time of film formation was $6 \times 10^{-6}$ Pa and the pressure at the time of film formation was $4.4 \times 10^{-1}$ Pa, while varying the other conditions per Example as shown in following Table 1. In continuation thereafter, with the ultimate vacuum at the time of film formation and the pressure at the time of film formation maintained the same, an SGZO film serving as an oxide semiconductor layer 508 was film-formed by sputtering to a thickness of 50 nm and a longitudinal/lateral width of 3 mm×4 mm. Next, post-annealing processing was carried out in an electric furnace in which the atmosphere could be controlled. The post-annealing atmosphere was made to be Ar: 160 sccm and $O_2$: 40 sccm, and the temperature was raised by 10° C./min to 200° C. After maintaining the structure at a temperature of 200° C. for 10 minutes, cooling to room temperature was carried out by furnace cooling. Note that in each of the film-formation by sputtering processes, the pattern was film-formed by using a metal mask. Further, the film-formed materials, that were fabricated by carrying out film-formation and post-annealing processing under the same conditions, were subjected to spreading resistance measurement, and it was confirmed that the resistivities of the oxide semiconductor layers 508 were lower than the resistivities of the oxide intermediate layers 506.

Thereafter, source/drain electrodes 510, 512 were film-formed by sputtering on the oxide intermediate layer 506 (the SGZO film). The film-formation of the source/drain electrodes 510, 512 was fabricated by using pattern film formation using a metal mask, and, after Ti was film-formed to 10 nm, Au was film-formed to 40 nm. The size of the source/drain electrodes 510, 512 was 1 mm square each, and the distance between the electrodes was 0.2 mm The TFTs of Examples 1 through 4 were fabricated in accordance with the above-described method.

On the other hand, TFTs, that had a structure in which the oxide intermediate layer 506 was not provided at the TFT 500 of Examples 1 through 4, were fabricated as the TFTs of Comparative Examples 1 through 3. Note that the fabrication method and the conditions other than those relating to the oxide intermediate layer 506 were the same as those of Examples 1 through 4.

Hereinafter, the fabrication conditions of the above-described respective Examples and Comparative Examples are shown in Table 1.

TABLE 1

|  | oxide intermediate layer | | | | oxide semiconductor layer | | | |
| --- | --- | --- | --- | --- | --- | --- | --- | --- |
|  | cationic structural elements | cation ratio (in left column order) | Ar flow rate (sccm) | $O_2$ flow rate (sccm) | cationic structural elements | cation ratio (in left column order) | Ar flow rate (sccm) | $O_2$ flow rate (sccm) |
| Ex. 1 | In, Ga, Zn | 1.0:1.0:1.0 | 30.00 | 2.00 | Sn, Ga, Zn | 1.0:1.0:1.0 | 30.00 | 1.000 |
| Ex. 2 | Sn, Ga, Zn | 1.0:1.0:1.0 | 30.00 | 2.00 | Sn, Ga, Zn | 1.0:1.0:1.0 | 30.00 | 1.000 |
| Comp. Ex. 1 |  | none |  |  | Sn, Ga, Zn | 1.0:1.0:1.0 | 30.00 | 1.000 |
| Ex. 3 | In, Ga, Zn | 1.0:1.0:1.0 | 30.00 | 2.00 | Sn, Ga, Zn | 1.0:1.0:5.5 | 30.00 | 0.150 |
| Comp. Ex. 2 |  | none |  |  | Sn, Ga, Zn | 1.0:1.0:5.5 | 30.00 | 0.150 |
| Ex. 4 | In, Ga, Zn | 1.0:1.0:1.0 | 30.00 | 2.00 | Sn, Ga, Zn | 2.0:0:5.5 | 30.00 | 0.150 |
| Comp. Ex. 3 |  | none |  |  | Sn, Ga, Zn | 2.0:0:5.5 | 30.00 | 0.150 |

Measurement of the transistor characteristic (Vg-Id characteristic) and the on current, the mobility μ were carried out on the TFTs of Examples 1 through 4 and Comparative Examples 1 through 3 that were obtained as described above, by using semiconductor parameter analyzer 4156C (manufactured by Agilent Technologies Co.). Note that the measurement of the Vg-Id characteristic was carried out by fixing the drain voltage (Vd) at 5 V and varying the gate voltage (Vg) within the range of −15 V to +40 V, and measuring the drain current (Id) at each gate voltage (Vg). Further, the on current Ion was the Id at Vg=20 V, from the obtained Vg-Id characteristic.

Figure 9:
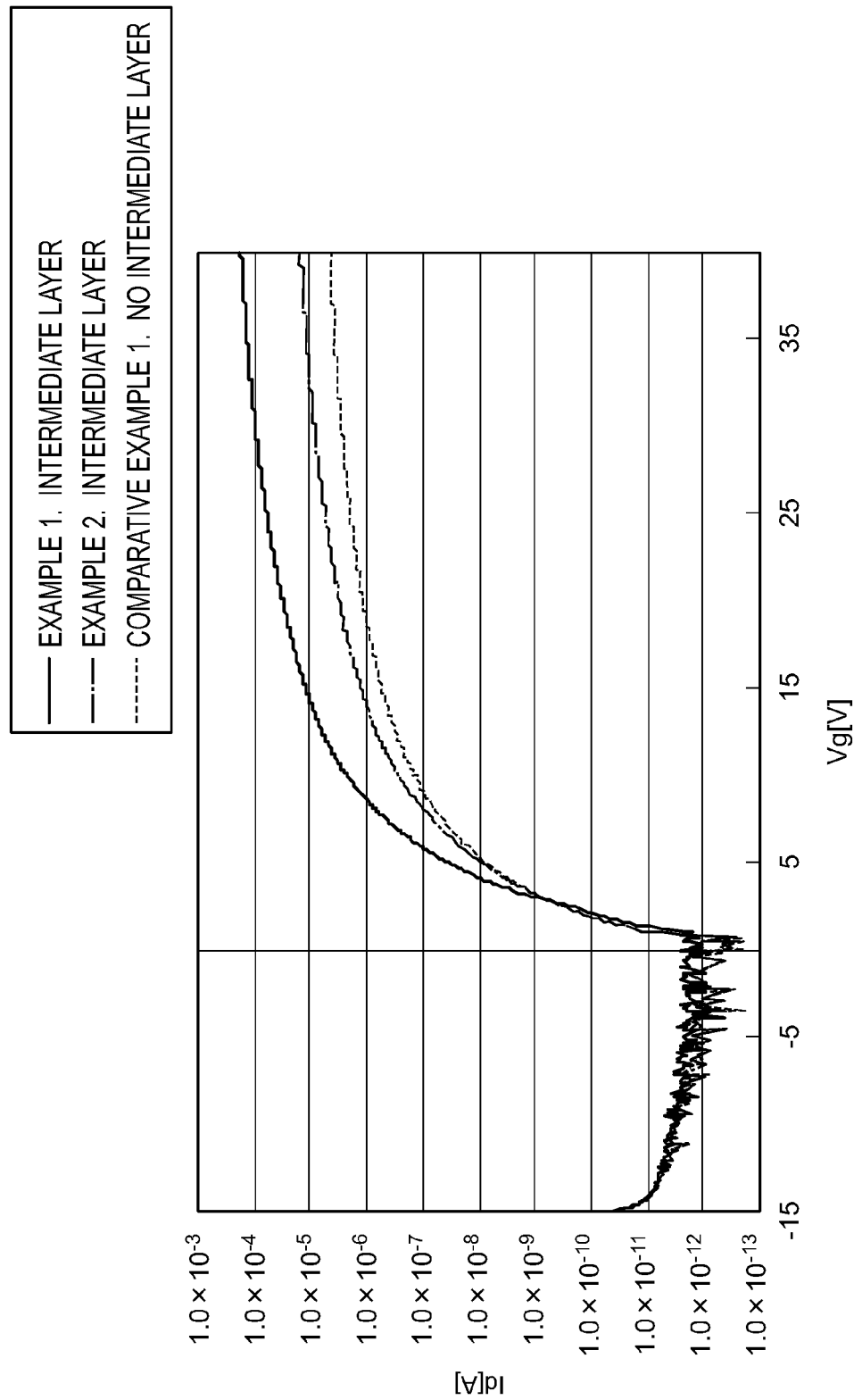
FIG. 9 is a drawing showing Vg-Id characteristics of TFTs of Examples 1, 2 and Comparative Example 1.

FIG. 9 is a drawing showing the Vg-Id characteristics at the TFTs of Examples 1, 2 and Comparative Example 1. Table 2 is a table that summarizes the respective characteristics at the TFTs of Examples 1, 2 and Comparative Example 1. Note that Ion in the table means the on current, and μ means the mobility.

TABLE 2

|  | oxide intermediate layer | | oxide semiconductor layer | | | |
| --- | --- | --- | --- | --- | --- | --- |
|  | cationic structural elements | cation ratio (in left column order) | cationic structural elements | cation ratio (in left column order) | Ion (mA) | μ (cm²/Vs) |
| Comp. Ex. 1 |  | none | Sn, Ga, Zn | 1.0:1.0:1.0 | $1.0 \times 10^{-6}$ | 0.1 |
| Ex. 2 | Sn, Ga, Zn | 1.0:1.0:1.0 | Sn, Ga, Zn | 1.0:1.0:1.0 | $3.1 \times 10^{-6}$ | 0.5 |
| Ex. 1 | In, Ga, Zn | 1.0:1.0:1.0 | Sn, Ga, Zn | 1.0:1.0:1.0 | $3.2 \times 10^{-5}$ | 7 |

As shown in FIG. 9 and Table 2, it can be understood that, at the TFTs of Examples 1, 2 that are provided with the oxide intermediate layer 506, the on current increases as compared with the TFT of Comparative Example 1 at which the oxide intermediate layer 506 is not provided. It can be understood that the mobilities as well of the TFTs of Examples 1, 2 increase as compared with the TFT of Comparative Example 1.

From the above, it was discovered that, when the oxide intermediate layer 506, whose resistivity is higher than the oxide semiconductor layer 508 whose main structural elements are Sn, Ga, Zn and O (Sn:Ga:Zn=1:1:1, and O in a nonstoichiometric amount), is provided between the oxide semiconductor layer 508 and the gate insulating film (thermally oxidized film 504), the on current and mobility are improved as compared with a case in which the oxide intermediate layer 506 is not provided.

Further, it was discovered that, at the TFT of Example 1 in which the oxide intermediate layer 506 was made to be IGZO, the mobility was remarkably improved as compared with the TFT of Comparative Example 1 in which there is no oxide intermediate layer 506 and the TFT of Example 2 in which the oxide intermediate layer 506 is made to be SGZO.

Figure 10:
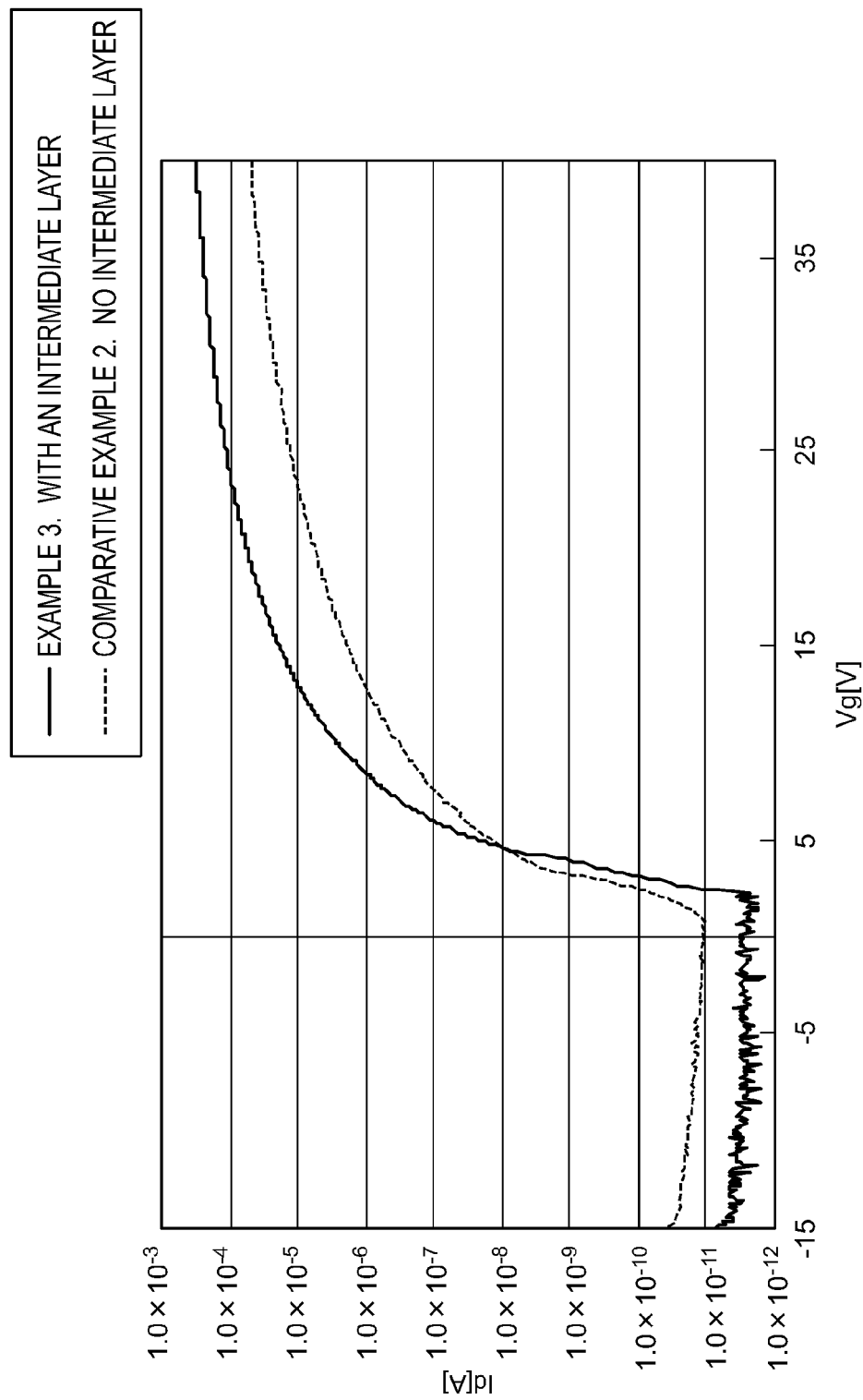
FIG. 10 is a drawing showing Vg-Id characteristics of TFTs of Example 3 and Comparative Example 2.

FIG. 10 is a drawing showing the Vg-Id characteristics at the TFTs of Example 3 and Comparative Example 2. Table 3 is a table summarizing the respective characteristics at the TFTs of Example 3 and Comparative Example 2.

TABLE 3

|  | oxide intermediate layer | | oxide semiconductor layer | | | |
| --- | --- | --- | --- | --- | --- | --- |
|  | cationic structural elements | cation ratio (in left column order) | cationic structural elements | cation ratio (in left column order) | Ion (mA) | μ (cm²/Vs) |
| Comp. Ex. 2 | none | | Sn, Ga, Zn | 1.0:1.0:5.5 | $5.7 \times 10^{-6}$ | 2 |
| Ex. 3 | In, Ga, Zn | 1.0:1.0:1.0 | Sn, Ga, Zn | 1.0:1.0:5.5 | $5.6 \times 10^{-5}$ | 11 |

As shown in FIG. 10 and Table 3, it can be understood that, at the TFT of Example 3 that is provided with the oxide intermediate layer 506, the on current increases as compared with the TFT of Comparative Example 2 at which the oxide intermediate layer 506 is not provided. It can be understood that the mobility as well of the TFT of Example 3 increases as compared with the TFT of Comparative Example 2.

From the above, it was discovered that, in Example 3, although the composition ratio (the Zn composition ratio) of the oxide semiconductor layer 508 was changed as compared with Examples 1, 2, in this case as well, when the oxide intermediate layer 506, whose resistivity is higher than the oxide semiconductor layer 508 whose main structural elements are Sn, Ga, Zn and O (Sn:Ga:Zn=1:1:5.5, and O in a nonstoichiometric amount), is provided between the oxide semiconductor layer 508 and the gate insulating film (thermally oxidized film 504), the on current and mobility are improved as compared with a case in which the oxide intermediate layer 506 is not provided.

Figure 11:
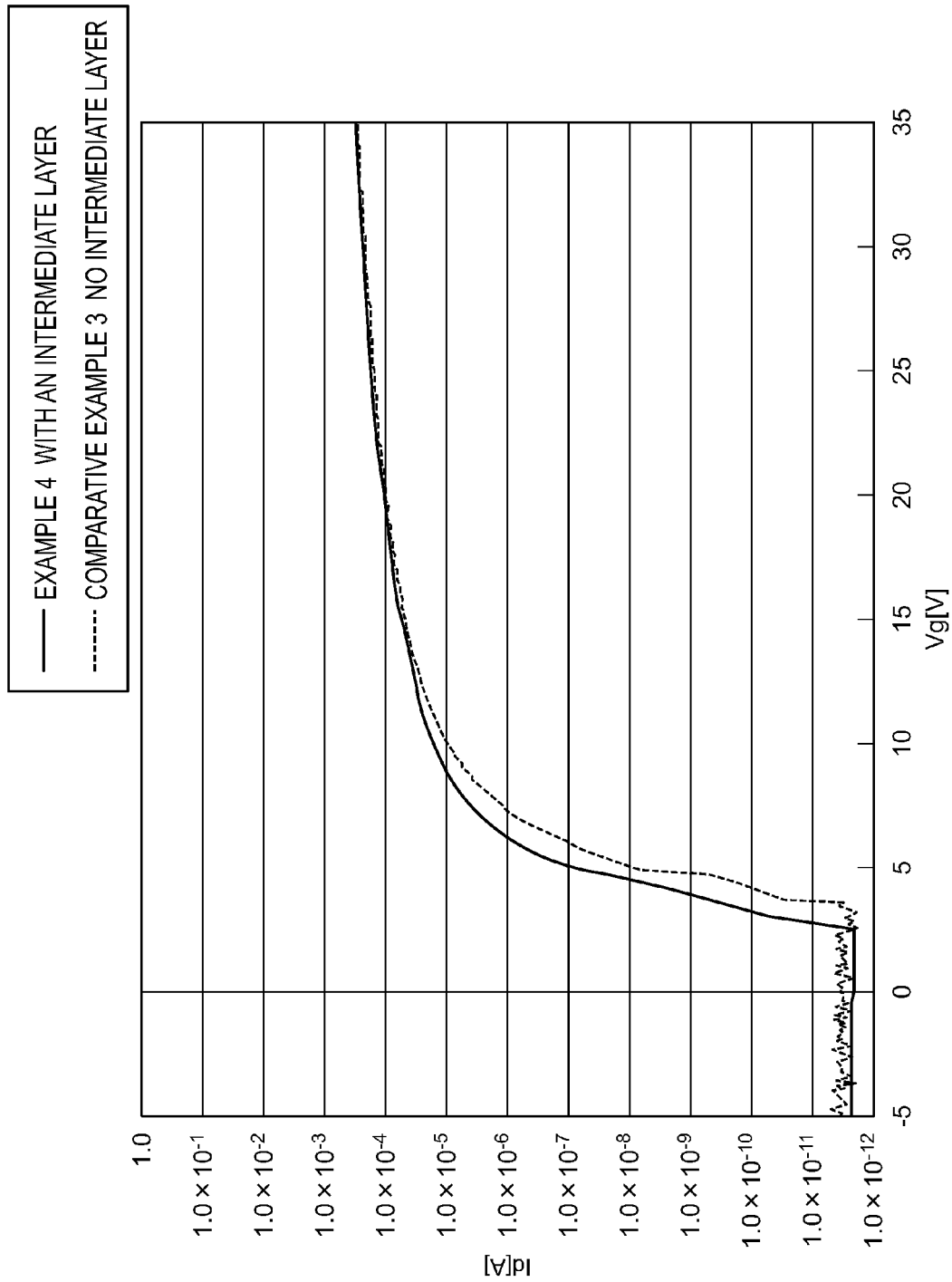
FIG. 11 is a drawing showing Vg-Id characteristics of Example 4 and Comparative Example 3.

FIG. 11 is a drawing showing the Vg-Id characteristics of Example 4 and Comparative Example 3. Table 4 is a table summarizing the respective characteristics at the TFTs of Example 4 and Comparative Example 3.

TABLE 4

|  | oxide intermediate layer | | oxide semiconductor layer | | | |
| --- | --- | --- | --- | --- | --- | --- |
|  | cationic structural elements | cation ratio (in left column order) | cationic structural elements | cation ratio (in left column order) | Ion (mA) | μ (cm²/Vs) |
| Comp. Ex. 3 | none | | Sn, Ga, Zn | 2.0:0:5.5 | $8.1 \times 10^{-5}$ | 8 |
| Ex. 4 | In, Ga, Zn | 1.0:1.0:1.0 | Sn, Ga, Zn | 2.0:0:5.5 | $9.9 \times 10^{-5}$ | 12 |

As shown in FIG. 11 and Table 4, it can be understood that, in Example 4 that is provided with the oxide intermediate layer 506, the on current increases as compared with Comparative Example 3 at which the oxide intermediate layer 506 is not provided. It can be understood that the mobility as well of the TFT of Example 4 increases as compared with the TFT of Comparative Example 3.

From the above, it was discovered that, in Example 4, although the entire composition ratio of the oxide semiconductor layer 508 was changed as compared with Examples 1, 2, in this case as well, when the oxide intermediate layer 506, whose resistivity is higher than the oxide semiconductor layer 508 whose main structural elements are Sn, Zn and O (Sn:Ga:Zn=2.0:0:5.5, and O in a nonstoichiometric amount), is provided between the oxide semiconductor layer 508 and the gate insulating film (thermally oxidized film 504), the on current and mobility are improved as compared with a case in which the oxide intermediate layer 506 is not provided.

Next, it was evaluated whether or not the on current and mobility improved when the oxide intermediate layer 506 was provided as compared with a case in which it was not provided, when the oxide semiconductor layer 508 was changed from an SGZO film to an IGZO film.

For this evaluation, TFTs of Comparative Examples 4 through 6 were fabricated by a method similar to that described above. The fabrication conditions of Comparative Examples 4 through 6 are shown hereinafter in Table 5.

TABLE 5

|  | oxide intermediate layer | | | | oxide semiconductor layer | | | |
| --- | --- | --- | --- | --- | --- | --- | --- | --- |
|  | cationic structural elements | cation ratio (in left column order) | Ar flow rate (sccm) | O₂ flow rate (sccm) | cationic structural elements | cation ratio (in left column order) | Ar flow rate (sccm) | O₂ flow rate (sccm) |
| Comp. Ex. 4 | none | | | | In, Ga, Zn | 1.0:1.0:1.0 | 30 | 0.15 |
| Comp. Ex. 5 | Sn, Ga, Zn | 1.0:1.0:1.0 | 30 | 2 | In, Ga, Zn | 1.0:1.0:1.0 | 30 | 0.15 |
| Comp. Ex. 6 | In, Ga, Zn | 1.0:1.0:1.0 | 30 | 2 | In, Ga, Zn | 1.0:1.0:1.0 | 30 | 0.15 |

Measurement of the transistor characteristic (Vg-Id characteristic) and the mobility μ were carried out on the TFTs of Comparative Examples 4 through 6 that were obtained as described above, by using semiconductor parameter analyzer 4156C (manufactured by Agilent Technologies Co.).

Figure 12:
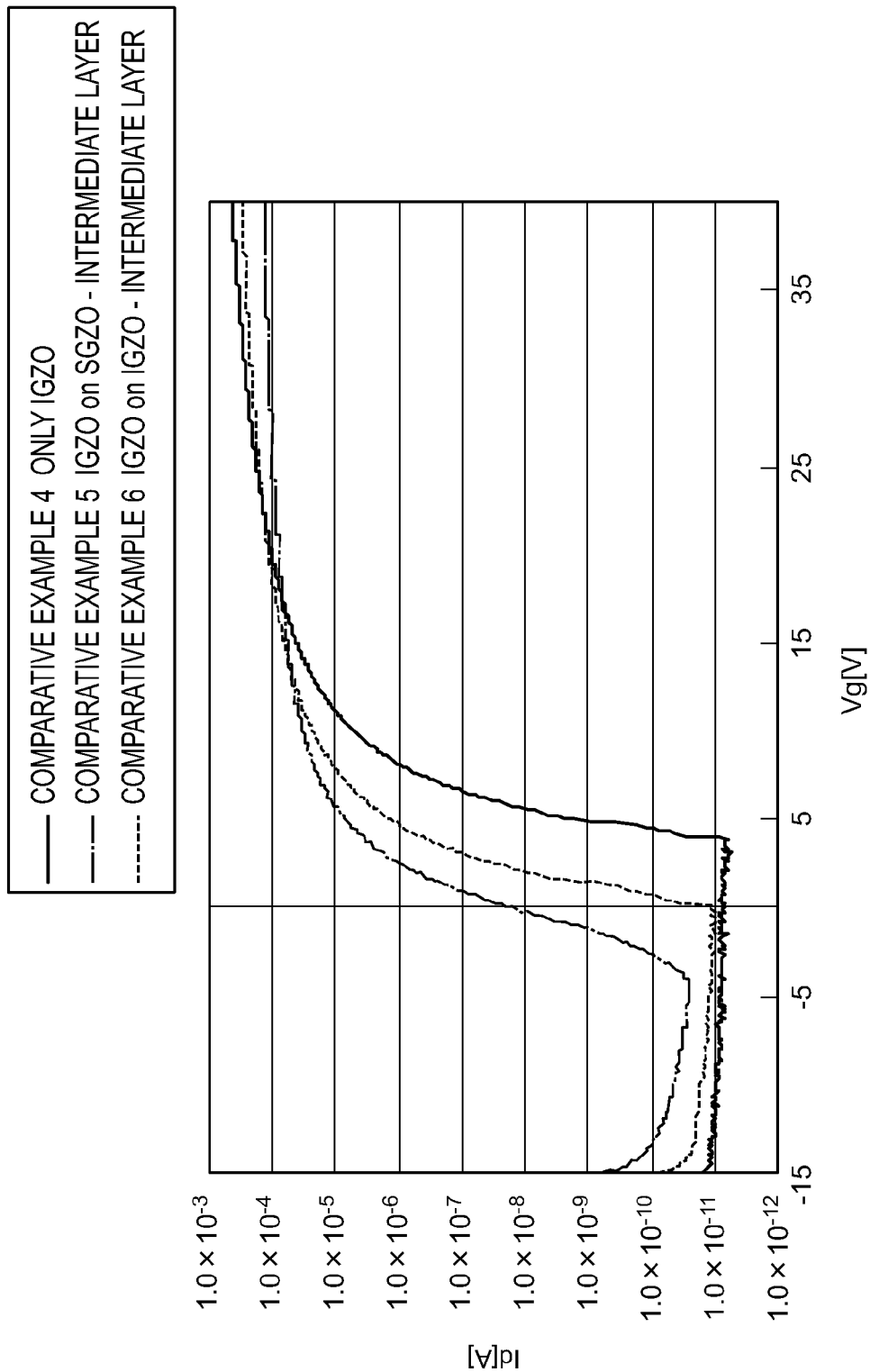
FIG. 12 is a drawing showing Vg-Id characteristics of Comparative Examples 4 through 6.

FIG. 12 is a drawing showing the Vg-Id characteristics of Comparative Examples 4 through 6. Table 6 is a table that summarizes the respective characteristics at the TFTs of Comparative Examples 4 through 6.

TABLE 6

| | oxide intermediate layer | | oxide semiconductor layer | | | |
|---|---|---|---|---|---|---|
| | cationic structural elements | cation ratio (in left column order) | cationic structural elements | cation ratio (in left column order) | Ion (mA) | μ (cm$^2$/Vs) |
| Comp. Ex. 4 | none | | In, Ga, Zn | 1.0:1.0:1.0 | $1.0 \times 10^{-4}$ | 15 |
| Comp. Ex. 5 | Sn, Ga, Zn | 1.0:1.0:1.0 | In, Ga, Zn | 1.0:1.0:1.0 | $8.2 \times 10^{-5}$ | 9 |
| Comp. Ex. 6 | In, Ga, Zn | 1.0:1.0:1.0 | In, Ga, Zn | 1.0:1.0:1.0 | $1.2 \times 10^{-4}$ | 5 |

As shown in FIG. 12 and Table 6, it can be understood that, at the TFTs of Comparative Examples 5, 6 that are provided with the oxide intermediate layer 506, the on current substantially does not vary as compared with the TFT of Comparative Example 4 at which the oxide intermediate layer 506 is not provided. It can be understood that the mobilities of Comparative Examples 5, 6 that are provided with the oxide intermediate layer 506 decrease as compared with Comparative Example 4 at which the oxide intermediate layer 506 is not provided.

From the above, it was discovered that, in the case of the oxide semiconductor layer 508 that is formed from an IGZO film, differently than the case of the oxide semiconductor layer 508 that is formed from an SGZO film, even if the oxide intermediate layer 506 is provided, the on current substantially does not vary and the mobility worsens instead, as compared with a case in which the oxide intermediate layer 506 is not provided.

Note that the cation composition ratios of the oxide semiconductor layer 508 and the oxide intermediate layer 506 in the above-described respective Examples and Comparative Examples express the composition ratios of the films after film formation. The composition ratios of the films after film formation were evaluated by using a fluorescent X-ray analyzer (Axios manufactured by Panalytical). Further, as a result of X-ray diffraction measurement of the oxide semiconductor layer 508 and the oxide intermediate layer 506 in each of the examples, no peaks expressing a crystal structure were confirmed, and all were amorphous.

What is claimed is:

1. A field effect transistor comprising:
    a gate insulating film;
    an oxide semiconductor layer that serves as an active layer and whose structural elements are Sn, Zn and O, or Sn, Ga, Zn and O; and
    an oxide intermediate layer that is disposed between the gate insulating film and the oxide semiconductor layer and whose structural elements are In, Ga, Zn, and O, and whose resistivity is higher than that of the oxide semiconductor layer,
    wherein, in a case in which an element composition ratio of the oxide semiconductor layer is Sn:Ga:Zn =a:b:c, the element composition ratio satisfies a+b=2, and $1 \leq a \leq 2$, and $1 \leq c \leq 11/2$, and $c \geq -7b/4+11/4$.

2. The field effect transistor of claim 1, wherein main structural elements of the oxide semiconductor layer are Sn, Ga, Zn and O.

3. The field effect transistor of claim 1, wherein the oxide semiconductor layer is amorphous.

4. The field effect transistor of claim 1, wherein a resistivity of the oxide semiconductor layer is greater than or equal to 1 Ωcm and less than or equal to $1 \times 10^6$ Ωcm.

5. The field effect transistor of claim 1, wherein a film thickness of the oxide intermediate layer is greater than or equal to 1nm and less than or equal to 50 nm.

6. A display device comprising the field effect transistor of claim 1.

7. A sensor comprising the field effect transistor of claim 1.

8. A method of fabricating a field effect transistor comprising, in order:
    a first step of film-forming, on a gate insulating film that is formed on a substrate, an oxide intermediate layer whose main structural elements are In, Ga, Zn and O;
    a second step of film-forming, on the oxide intermediate layer, an oxide semiconductor layer whose main structural elements are Sn, Zn and O, or Sn, Ga, Zn and O, and that, in a case in which an element composition ratio of the structural elements is Sn:Ga:Zn =a:b:c, the element composition ratio satisfies a+b=2, and $1 \leq a \leq 2$, and $1 \leq c \leq 11/2$, and $c \geq -7b/4+11/4$; and
    a third step of carrying out a heat treatment at greater than or equal to 100° C. and less than 300° C.

9. The method of fabricating a field effect transistor of claim 8, wherein the oxide semiconductor layer and the oxide intermediate layer are film-formed by sputtering.

10. A method of fabricating a field effect transistor comprising:
    a first step of film-forming, on a substrate, an oxide semiconductor layer whose main structural elements are Sn, Zn and O, or Sn, Ga, Zn and O, and that, in a case in which an element composition ratio of the structural elements is Sn:Ga:Zn =a:b:c, the element composition ratio satisfies a+b=2, and $1 \leq a \leq 2$, and $1 \leq c \leq 11/2$, and $c \geq -7b/4+11/4$;
    a second step of film forming, on the oxide semiconductor layer, an oxide intermediate layer whose main structural elements are In, Ga, Zn and O;
    a third step of forming a gate insulating film on the oxide intermediate layer; and
    a fourth step of, after the second step or after the third step, carrying out a heat treatment at greater than or equal to 100° C. and less than 300° C.

11. The method of fabricating a field effect transistor of claim 10, wherein the oxide semiconductor layer and the oxide intermediate layer are film-formed by sputtering.

* * * * *